United States Patent
Tang et al.

(10) Patent No.: US 8,097,494 B2
(45) Date of Patent: Jan. 17, 2012

(54) METHOD OF MAKING AN INTEGRATED CIRCUIT PACKAGE WITH SHIELDING VIA RING STRUCTURE

(75) Inventors: Jinbang Tang, Chandler, AZ (US);
Darrel Frear, Phoenix, AZ (US);
Jong-Kai Lin, Chandler, AZ (US); Marc A. Mangrum, Manchaca, TX (US);
Robert E. Booth, Austin, TX (US);
Lawrence N. Herr, Coupland, TX (US);
Kenneth R. Burch, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 8 days.

(21) Appl. No.: 12/688,580

(22) Filed: Jan. 15, 2010

(65) Prior Publication Data
US 2011/0003435 A1 Jan. 6, 2011

Related U.S. Application Data

(63) Continuation of application No. 11/961,827, filed on Dec. 20, 2007, now Pat. No. 7,651,889, which is a continuation-in-part of application No. 11/854,776, filed on Sep. 13, 2007, now abandoned.

(51) Int. Cl.
*H01L 21/44* (2006.01)
*H01L 21/48* (2006.01)
*H01L 21/50* (2006.01)

(52) U.S. Cl. .......... 438/114; 438/126; 257/E21.502

(58) Field of Classification Search .......... 438/114, 438/126; 257/E21.502
See application file for complete search history.

(56) References Cited

U.S. PATENT DOCUMENTS

| | | | |
|---|---|---|---|
| 7,791,203 B2 * | 9/2010 | Boon et al. | 257/773 |
| 2002/0005570 A1 * | 1/2002 | Jiang et al. | 257/666 |
| 2004/0209355 A1 * | 10/2004 | Edman et al. | 435/287.2 |
| 2007/0228468 A1 * | 10/2007 | Wakabayashi et al. | 257/347 |

* cited by examiner

*Primary Examiner* — Phuc Dang
(74) *Attorney, Agent, or Firm* — David G. Dolezal

(57) ABSTRACT

Electromagnetic shielding for an integrated circuit packaged device. The method includes forming shielding structures by forming openings in an encapsulated structure. The openings are filled with conductive material that surrounds at least one die. The encapsulated structure may include a plurality of integrated circuit die. A layered redistribution structure is formed on one side of the encapsulated structure.

16 Claims, 16 Drawing Sheets

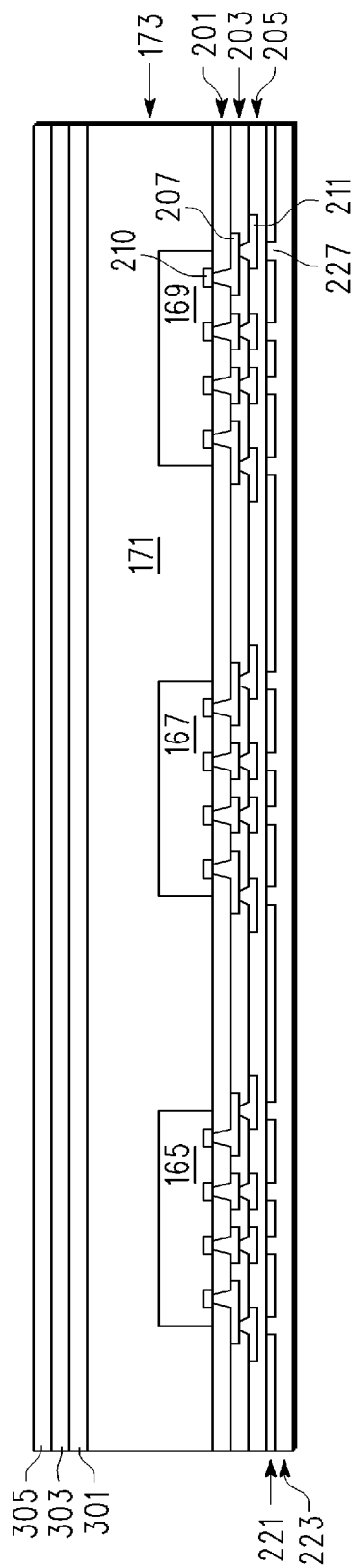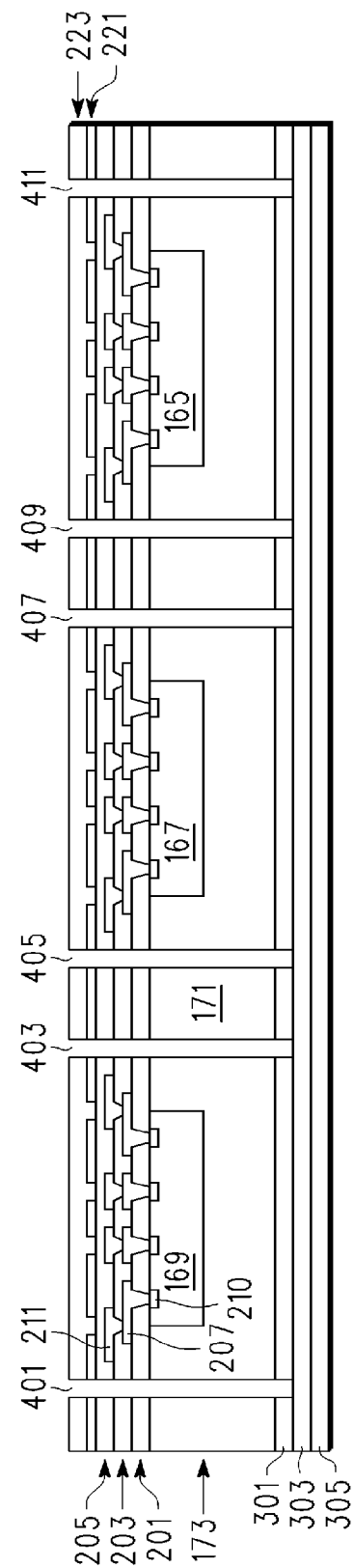

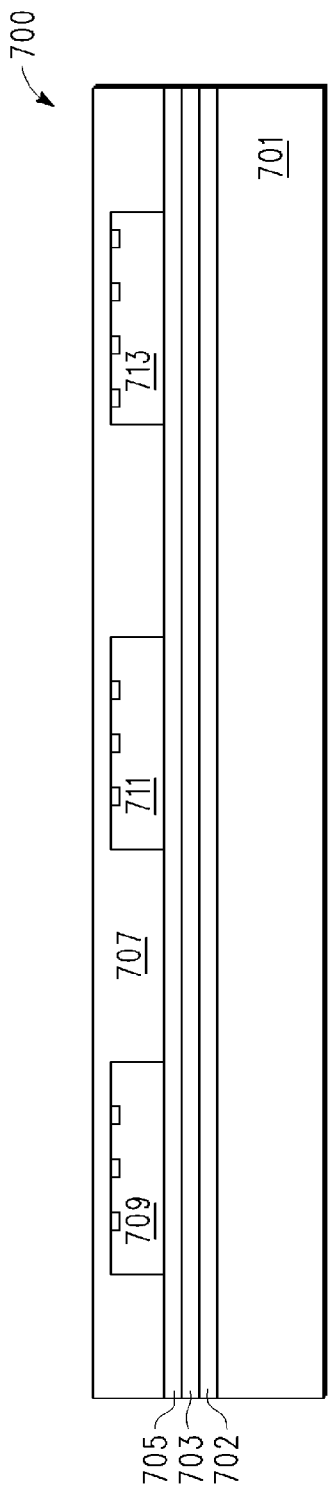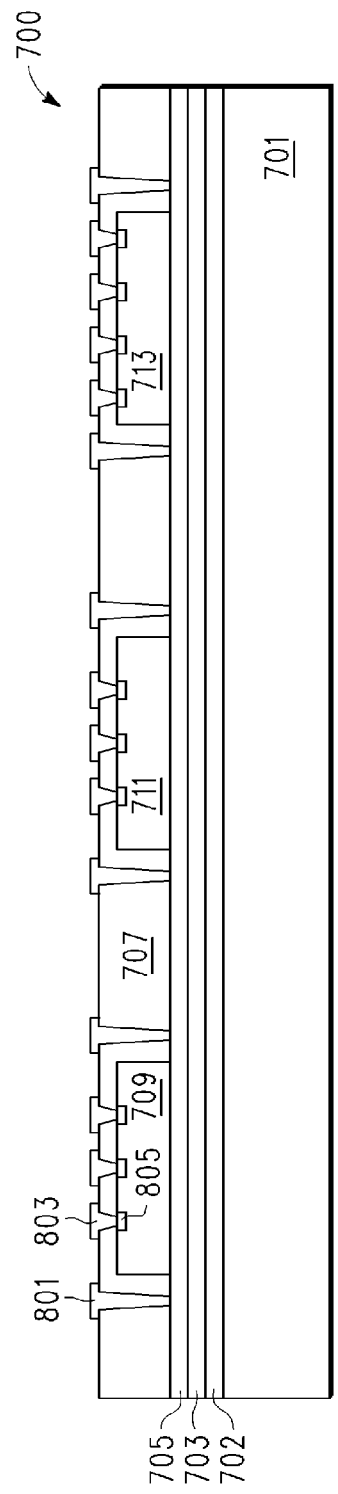

METHOD OF MAKING AN INTEGRATED CIRCUIT PACKAGE WITH SHIELDING VIA RING STRUCTURE

RELATED APPLICATIONS

This application is a continuation of Ser. No. 11/961,827, filed Dec. 20, 2007, now U.S. Pat. No. 7,651,889, which is a continuation-in-part of U.S. application Ser. No. 11/854,776 entitled "Integrated Shielding Process for Precision High Density Module Packaging," having a common assignee and filed on Sep. 13, 2007 (now abandoned), all of which is incorporated by reference in its entirety. incorporated by reference in its entirety.

BACKGROUND OF THE INVENTION

1. Field of the Invention

This invention relates in general to integrated circuits and more particularly to providing shielding for encapsulated integrated circuits.

2. Description of the Related Art

Some integrated circuits are implemented in packages having electromagnetic shields for protection from electromagnetic interference (EMI). An example of such packages includes multiple chip modules (MCM) which have a plurality of discrete microelectronic devices (e.g., a processor unit, memory unit, related logic units, resistors, capacitors, inductors, and the like) that are connected together on a single MCM substrate. These shielding structures may be formed prior to encapsulation of the integrated circuit die or formed separately from the integrated circuit die.

However, such methods may not be compatible with packaging processes where post interconnect processing is performed after die encapsulation.

BRIEF DESCRIPTION OF THE DRAWINGS

The present invention may be understood, and its numerous objects, features and advantages obtained, when the following detailed description is considered in conjunction with the following drawings, in which:

FIGS. 14-19 are side cutaway views of a various stages in the manufacture of integrated circuit packages according to another embodiment of the present invention;

FIGS. 20-22 are side cutaway views of a various stages in the manufacture of integrated circuit packages according to another embodiment of the present invention;

Figure 1:
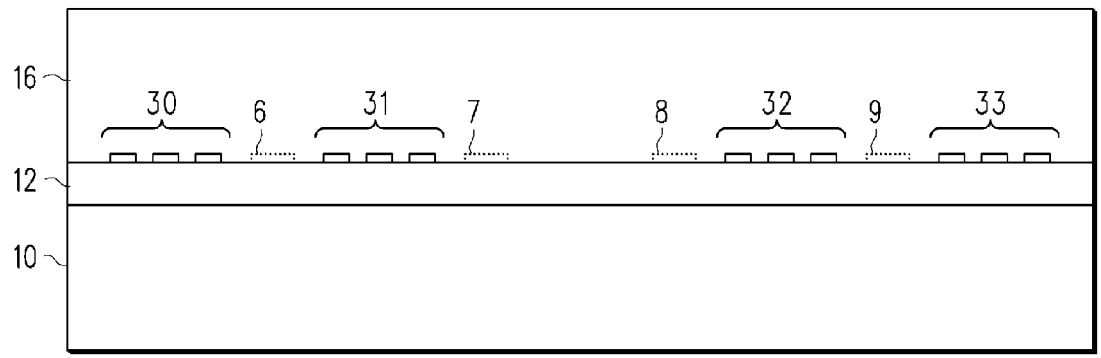
FIG. 1 is a cross-sectional view of a plurality of chip modules (and grounding frame) which are mounted on a layer of double-sided tape or attachment chemical and a process carrier substrate and a encapsulated with a molding compound in accordance with one embodiment.

It will be appreciated that for simplicity and clarity of illustration, elements illustrated in the drawings have not necessarily been drawn to scale. For example, the dimensions of some of the elements are exaggerated relative to other elements for purposes of promoting and improving clarity and understanding. Further, where considered appropriate, reference numerals have been repeated among the drawings to represent corresponding or analogous elements.

DETAILED DESCRIPTION

The following sets forth a detailed description of a mode for carrying out the invention. The description is intended to be illustrative of the invention and should not be taken to be limiting.

A method and apparatus are described for fabricating high density encapsulated semiconductor device or devices with integrated shielding. As a preliminary step, a plurality of circuit devices and an optional embedded grounding frame are assembled as a panel by mounting the circuit devices on a process carrier using a removable attachment device, such as a thick double-sided tape or chemical attachment layer. This assembly occurs prior to forming the underlying circuit substrate (also referred to in this application as a layered redistribution structure). Once the circuit devices are affixed to the removable attachment device, the circuit devices are encapsulated with a molding compound or resin. By drilling the molding compound to form via openings between individual circuit devices (e.g., with a laser cutting tool or other appropriate cutting technique) and then filling the via openings with a conductive or other appropriate shielding material (e.g., by sputtering, spraying, plating, etc.), shielding via ring structures are formed in the molding compound to encircle and shield the circuit device(s). In various embodiments, the via openings formed in the molding compound can be formed with at least a single continuous opening or groove that encircles one (or more) individual circuit devices, thereby forming one or more shielding via ring structures to shield the one (or more) individual circuit devices from electromagnetic interference. Alternatively, the via openings can be formed as a plurality of discrete openings of any desired shape (e.g., circular, square, oval, rectangular, etc.) that are positioned to encircle one (or more) individual circuit devices, thereby forming one or more shielding via ring structures to shield the one (or more) individual circuit devices from electromagnetic interference. At this point or subsequently, a layer of a conductive material or other appropriate shielding material is formed on the top of the molding compound as a top shielding cover which makes electrical contact with the shielding via ring structures formed in the molding compound. As formed, the shielding via ring structures extend completely through the molding compound and are exposed on the bottom of the molding compound (device I/O side). After the removable attachment device is released, a multi-layer circuit substrate with shielding via structures is then built on the bottom of the molding compound. By building up the circuit substrate with its shielding via structures properly aligned and electrically connected to the exposed shielding via ring structures formed in the bottom of the molding compound, an integrated EMI shield is provided for specific functional circuit block and/or entire module. In selected embodiments, the shielding via ring structure(s) may be connected with a ground ring. After forming the multi-layer circuit substrate with shielding via structures electrically connected to the shielding via ring structures, the panel is cut, sawed, or otherwise separate into singulated package dice.

Various illustrative embodiments will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified cross sectional drawings of a semiconductor device without including every device feature or geometry in order to avoid limiting or obscuring the present invention. It is also noted that, throughout this detailed description, certain materials will be formed and removed to fabricate the semiconductor structure. Where the specific procedures for forming or removing such materials are not detailed below, conventional techniques to one skilled in the art for growing, depositing, removing or otherwise forming such layers at appropriate thicknesses shall be intended. Such details are well known and not considered necessary to teach one skilled in the art of how to make or use the present invention.

Figure 2:
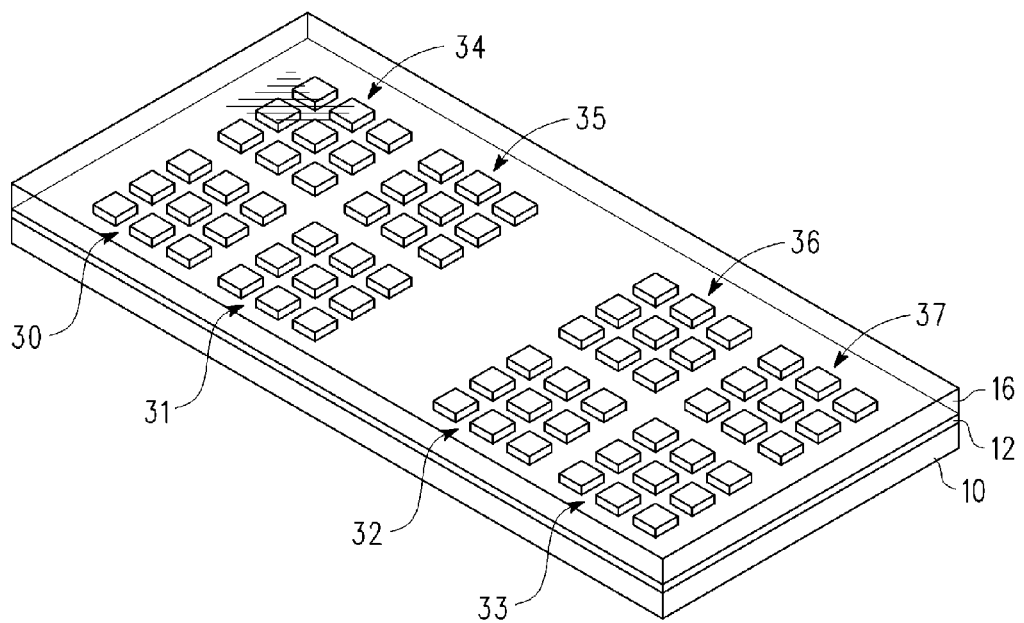
FIG. 2 illustrates a perspective view of the encapsulated plurality of chip modules (panel) depicted in FIG. 1.

Turning now to FIG. 1, a cross-sectional view is illustrated of a plurality of chip modules 30-33 which are mounted as a panel on a removable attachment device 12 (e.g., a double-sided tape or an attachment chemical layer) and a process carrier substrate 10. In addition, FIG. 2 is provided to illustrate a perspective exterior view of the encapsulated plurality of chip modules (panel) depicted in FIG. 1. As illustrated, each chip module (e.g., 30) includes a plurality of microelectronic devices (e.g., a processor unit, memory unit, related logic units, resistors, capacitors, inductors, and the like), though it will be appreciated that the advantages of the present invention may also be obtained if each chip module includes only a single microelectronic or circuit device. If desired, each chip module may also have a grounding frame disposed adjacent to the chip module circuit(s) from grounding frame layers 6-9. In FIG. 1 (but not in FIG. 2), the grounding frame elements 6-9 are depicted with dashed lines to indicate that these structures are optionally provided at this point in the fabrication process. For example, grounding frame layers 6 and 7 form a grounding frame or ring around a first circuit device 31, while grounding frame layers 8 and 9 form a grounding frame or ring around a second circuit device 32. Each microelectronic device in the chip modules 30-33 (and any grounding frame layers) may be mounted or attached on top of the removable attachment device 12 and process carrier 10 to fix them in place. The purpose of the removable attachment device 12 is to secure the encapsulated chip modules 30-33 during the subsequent fabrication process so that a shielding material may be integrally formed in the encapsulation packaging prior forming the underlying multilayer circuit substrate. With this purpose in mind, any desired attachment technique may be used to implement the removable attachment device 12, including but not limited to applying a thick double-sided tape, glue layer or other removable die attach material between the lower surface of the circuit substrate and the process carrier 10.

As further illustrated in FIGS. 1 and 2, the plurality of chip modules 30-37 are encapsulated with an insulating package body or molding 16 which may be formed by applying, injecting or otherwise forming an encapsulant to seal and protect the microelectronic devices in the chip modules from moisture, contamination, corrosion, and mechanical shock. For example, after affixing the microelectronic devices 30-37 to the removable attachment device 12, an encapsulation process is performed to cover the chip modules with a mold compound or mold encapsulant. The mold encapsulant may be a silica-filled resin, a ceramic, a halide-free material, or some other protective encapsulant layer. The mold encapsulant is typically applied using a liquid, which is then heated to form a solid by curing in a UV or ambient atmosphere. The encapsulant can also be a solid that is heated to form a liquid and then cooled to form a solid mold. As will be appreciated, any desired encapsulant process may be used. At this point, the removable attachment device 12 and process carrier 10 may be removed if desired; however, the removal step can also occur later in the fabrication process, such as described herein below where the removable attachment device 12 is released after the shielding via structures are formed in the insulating package body 16.

Figure 3:
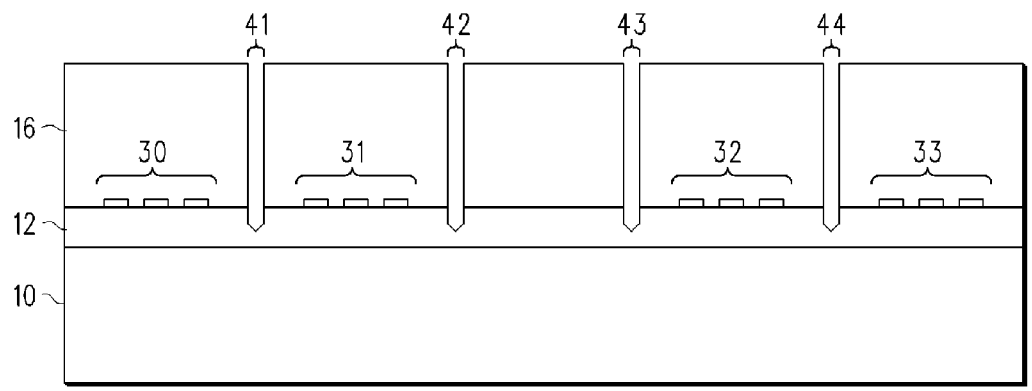
FIG. 3 illustrates processing subsequent to FIG. 1 with a cross-sectional view of the encapsulated plurality of chip modules after vias are formed in the molding compound between individual circuit modules by drilling through at least the molding compound.
Figure 4A:
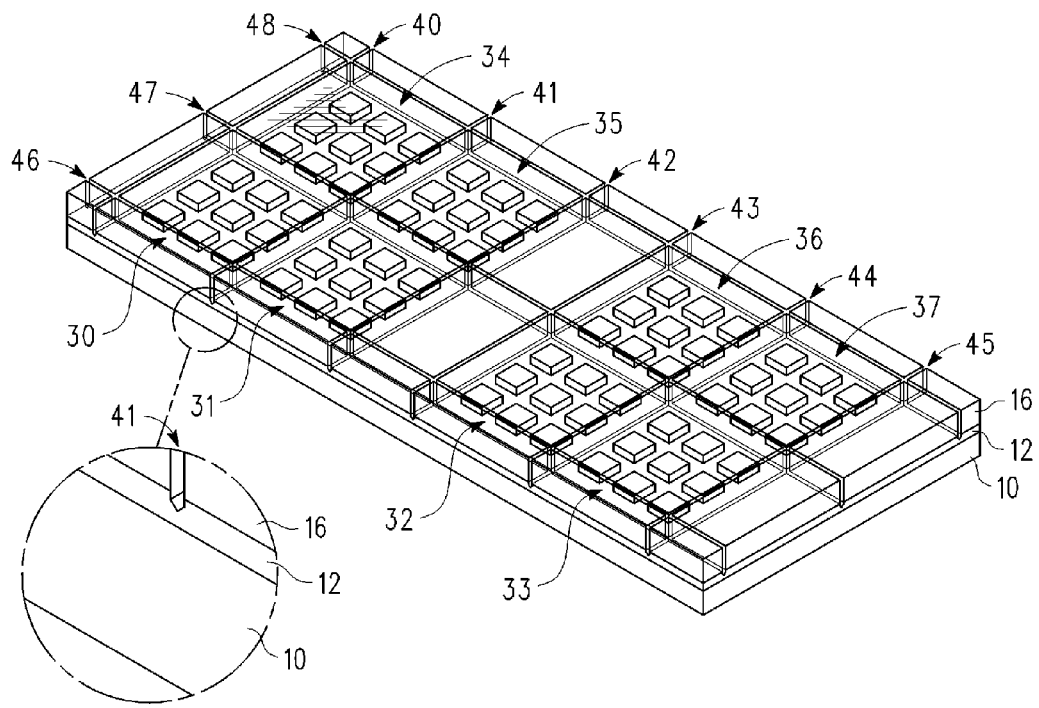
FIG. 4a illustrates an example perspective view of the encapsulated plurality of chip modules (panel) depicted in FIG. 3 to show how the vias may be formed as continuous grooves or openings.
Figure 4B:
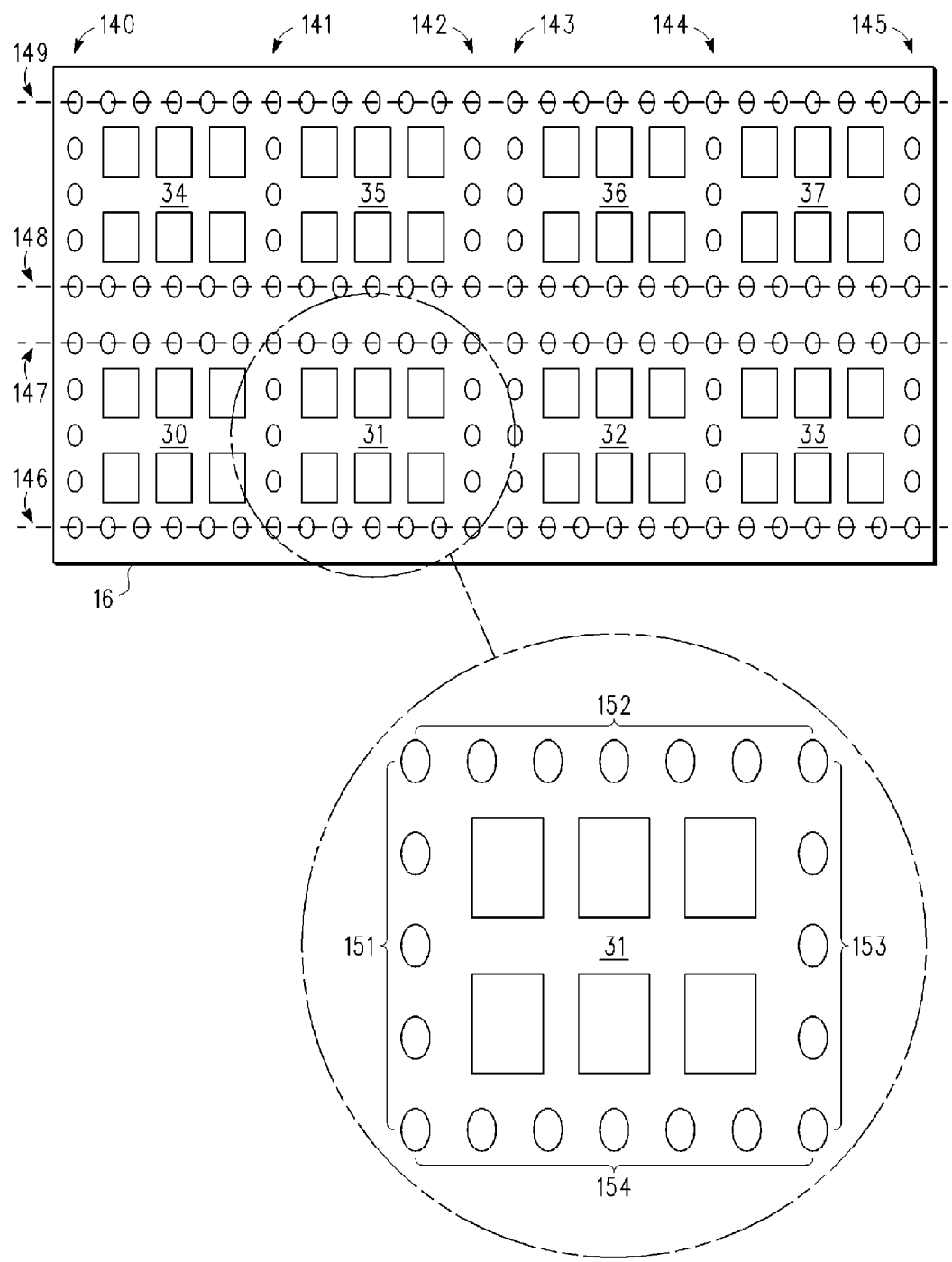
FIG. 4b illustrates an example plan view of an encapsulated plurality of chip modules (panel) depicted in FIG. 3 to show how the vias may be formed as a plurality of discrete openings of any desired shape.

After the packaged panel assembly is formed, the insulating package body 16 is cut to form via openings 41-44 between individual chip modules 30-33. This is depicted in FIG. 3 which illustrates processing subsequent to FIG. 1 with a cross-sectional view of the encapsulated plurality of chip modules 30-33 after via openings 41-44 are formed in the insulating package body 16 by cutting down through at least the insulating package body 16. In addition, FIG. 4a is provided to illustrate an example perspective exterior view of the encapsulated plurality of chip modules (panel) depicted in FIG. 3. As depicted, the cuts through the insulating package body 16 and into the removable attachment device 12 form grooves 40-48 which separate the chip modules 30-37, though it will be appreciated that the via openings can be made with shallower cuts. As illustrated in FIG. 4a, the via openings 40-48 may be formed in the insulating package body 16 with continuous cuts or grooves that intersect with one another, thereby forming one or more via openings that are positioned to encircle one (or more) individual chip modules. However, instead of using continuous groove openings, the via openings can be formed as a plurality of discrete openings that are positioned to collectively encircle one (or more) individual chip modules. An example implementation is depicted in FIG. 4b, which illustrates an example plan view of an encapsulated plurality of chip modules 31-37 to show how each of the via openings 140-149 may be formed in the insulating package body 16 as a plurality of discrete openings of any desired shape (e.g., circular, square, oval, rectangular, etc.). Thus, a plurality of separate via openings are drilled to surround the circuit module(s) 31, including via openings 151, 152, 153 and 154. By positioning a plurality of discrete openings to encircle one (or more) individual chip modules, shielding via ring structures can subsequently be formed by filling to shield the one (or more) individual circuit modules from electromagnetic interference. Though not shown in FIG. 4a or 4b, more than one ring of via openings can be formed around each circuit module(s) or device(s), thereby enhancing the shielding benefit provided by the subsequently formed shielding via structures.

As seen from the foregoing, the via openings can be formed as either continuous or discrete openings having any desired shape, provided that the via openings encircle the chip module(s) or device(s) that are to be shielded. In addition, the placement of the via openings (and the subsequently formed shielding via ring structures) may be controlled to provide local shielding for individual modules, as well as global shielding from external EMI sources. As an example of local shielding, the shielding via ring structures formed in the openings 151-154 shield module 31 from module 30, as well as from module 32. As an example of global shielding, the shielding via ring structures formed in the openings 147-146 help shield the modules 30-33 from external modules (e.g., modules 34-35). Those skilled in the art will appreciate that the shape, size and spacing of separate via openings may be controlled so as to achieve the EMI shielding benefits of the present invention, even when a single continuous groove opening is not used, because separate shielding via structures will effectively acts as a single shielding structure when positioned sufficiently close to one another. For this reason, the remaining description in the embodiment of FIGS. 1-13 is provided with reference to the groove embodiment depicted in FIGS. 3 and 4a, even though selected embodiments may be implemented with separate and discrete via openings, such as shown in FIG. 4b.

The via openings 41-44 are shown in FIG. 3 as having substantially vertical sidewalls that are separated by a predetermined minimum distance so that a conductive or shielding layer may be subsequently deposited to fill the via openings during subsequent processing. However, it will be appreciated that the via openings 41-44 may instead have angled sidewalls which may facilitate the subsequent deposition of the conductive/shielding layer, though at the expense of consuming valuable real estate. For example, the via openings 41-44 may be formed with a cutting instrument that forms a V-shaped cut for the entire via opening (not shown) since this shape is easier to cover with the deposited conductive shielding layer. With such a cut, the via opening is wider at the top of the mold compound and narrower at the bottom where it terminates in the removable attachment device 12. Whichever shape is used, the cut may be made with a saw having a cutting blade, a laser, or any other instrument that can controllably form the via openings 41-44 into the insulating package body and between the individual chip modules 30-37. In selected embodiments, the cutting instrument provides a depth cut that is greater than the height of the insulating package body 16 so that the groove extends into the removable attachment device 12, as illustrated with the enlarged cross-section shown in FIG. 4. In this way, the shielding layer subsequently formed in the via openings and connected to the shielding via structures in the subsequently-formed multi-layer circuit substrate will completely encapsulate the singulated modules. In addition, by controlling the cutting action so that the via openings terminate in the removable attachment device 12, the position of the individual chip modules 31-37 in relation to the process carrier 10 is maintained by virtue of the adhesive function provided by the removable attachment device 12, which helps facilitate subsequent handling or processing of the individual chip modules. Of course, it will be appreciated that any desired technique may be used to form the via openings 41-44, including but not limited to chemical patterning techniques, such as selectively etching the openings by patterning and anisotropically etching the via openings 41-44.

When cutting all the way down to the attachment device 12, it is important to position and align the cut lines so that the cuts do not intersect with the microelectronic devices in the chip modules 30-37. This is illustrated in FIG. 3, where each via opening (e.g., groove 41) is positioned between the chip modules (e.g., modules 30 and 31). One benefit of forming the via openings in the insulating package body 16 before forming the multi-layer circuit substrate is that the cutting of the via openings can not intersect with any conductive signal or voltage paths in the multi-layer circuit substrate since it is not yet formed. As will be appreciated, intersections with such conductive paths should ordinarily be avoided to prevent a short between the conductive path and the conductive shield layer subsequently formed in the via openings. However, in selected embodiments, the positioning and alignment of the via openings 41-44 may be deliberately controlled to intersect with the embedded grounding frame layers 6-9 (shown in FIG. 1) formed at the bottom of the in the insulating package body 16. This positioning allows a direct electrical connection to be established between the embedded grounding frame layers 6-9 and their respective conductive/shielding material subsequently formed in the via openings 41-44.

Figure 5:
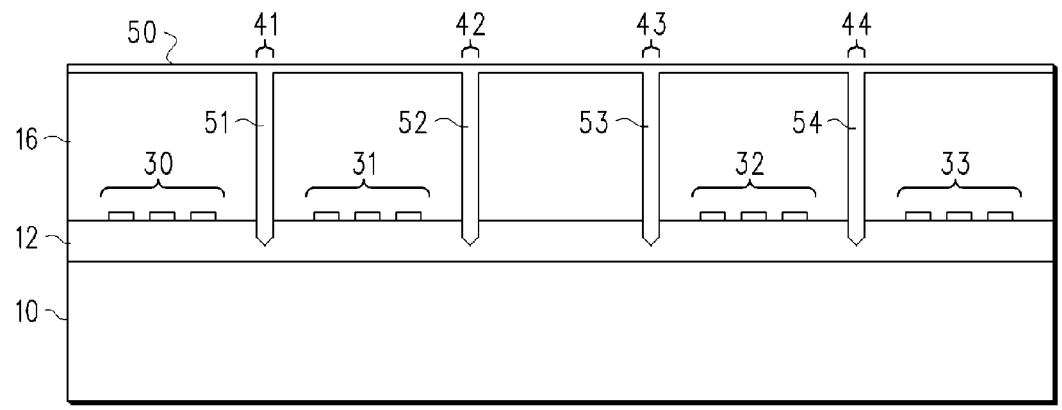
FIG. 5 illustrates processing subsequent to FIG. 3 with a cross-sectional view of the encapsulated plurality of chip modules after a conductive shielding layer is formed in at least the molding compound vias.

FIG. 5 illustrates processing subsequent to FIG. 3 with a cross-sectional view of the encapsulated plurality of chip modules 30-33 after a conductive shielding layer 50 is formed over the insulating package body 16 and in the via openings 41-44, thereby forming shielding via structures 51-54. The conductive shielding layer 50 can be a polymer, metal, metal alloy (such as a ferromagnetic or ferroelectric material), ink, paint, the like or combinations of the above. In one embodiment, the conductive shielding layer 50 is formed from aluminum (Al), copper (Cu), nickel iron (NiFe), tin (Sn), zinc (Zn), or the like, including any combination of one or more of the foregoing. For example, by forming the conductive shielding layer 50 as a combination of a non-ferromagnetic material and ferromagnetic material (e.g., a layer of copper and a layer of NiFe), then the circuit modules are protected from electromagnetic fields that are both electric and magnetic with a electromagnetic or broadband shield. Prior to depositing the conductive shielding layer 50, the upper surface of the insulating package body 16 and the via openings 41-44 may be prepared so that the conductive shielding layer 50 will adhere. The conductive shielding layer 50 can be deposited by physical vapor deposition (PVD), chemical vapor deposition (CVD), atomic layer deposition (ALD), electrolytic plating, electro-less plating, flame spray, conductive paint spray, vacuum metallization, pad printing, sputtering, evaporation, dispensing, spray coating, or the like, including any combination of one or more of the foregoing. While the conductive shielding layer 50 may be formed on each groove sidewall to a predetermined thickness, in selected embodiments the conductive shielding layer 50 is formed to partially or completely fill the via openings 41-44, depending on the desired shielding effectiveness. As will be appreciated, if the via openings 41-44 are only partially filled, subsequent processing will be used to completely encapsulate the individual chip modules with conductive shielding material, as described herein below.

Figure 6:
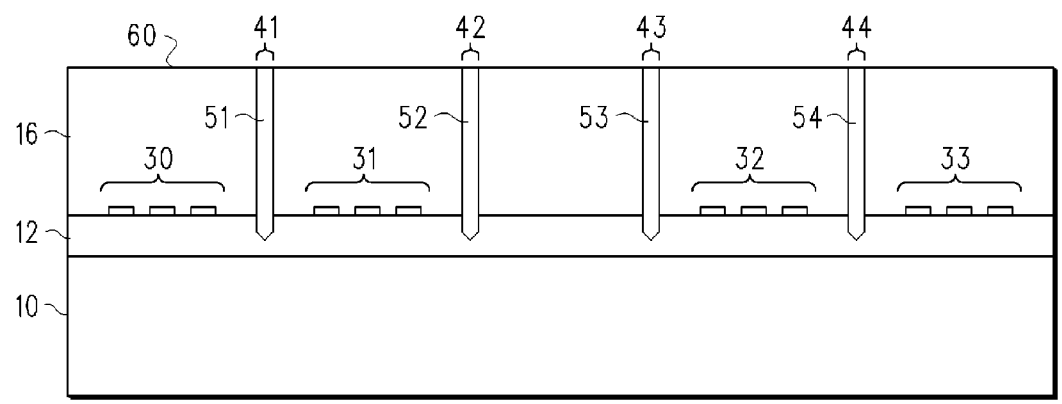
FIG. 6 illustrates processing subsequent to FIG. 5 with a cross-sectional view of the encapsulated plurality of chip modules after the molding compound is thinned.
Figure 7:
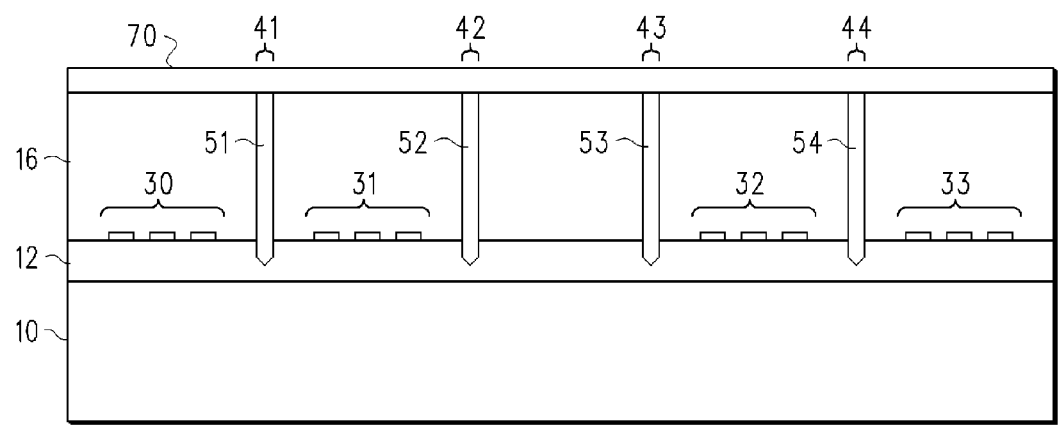
FIG. 7 illustrates processing subsequent to FIG. 6 with a cross-sectional view of the encapsulated plurality of chip modules after a shielding cover layer is formed over the thinned molding compound.

FIG. 6 illustrates processing subsequent to FIG. 5 with a cross-sectional view of the encapsulated plurality of chip modules 30-33 after the insulating package body 16 and shielding via structures 51-54 are optionally thinned. By grinding, sawing, abrading, polishing or using any desired technique to remove part of the insulating package body 16 and shielding via structures 51-54, the overall profile thickness of the final packaging may be reduced, thereby reducing the size of the final packaged devices. However, if the insulating package body 16 is thinned, any conductive shielding layer 50 formed on its top surface will be removed, and must be replaced with a subsequent process step in order to provide the device shielding. While this replacement process can occur at any time before the final package is assembled and singulated, in selected embodiments, a conductive shielding replacement layer may be added after the insulating package body 16 is thinned. For example, FIG. 7 illustrates processing subsequent to FIG. 6 with a cross-sectional view of the encapsulated plurality of chip modules 31-33 after a shielding cover layer 70 is formed over the thinned insulating package body 16 and in electrical contact with the shielding via structures 51-54. The shielding cover layer 70 can be deposited by PVD, CVD, ALD, electrolytic plating, electro-less plating, flame spray, conductive paint spray, vacuum metallization, pad printing, sputtering, evaporation, dispensing, spray coating, or the like, including any combination of one or more of the foregoing.

Figure 8A:
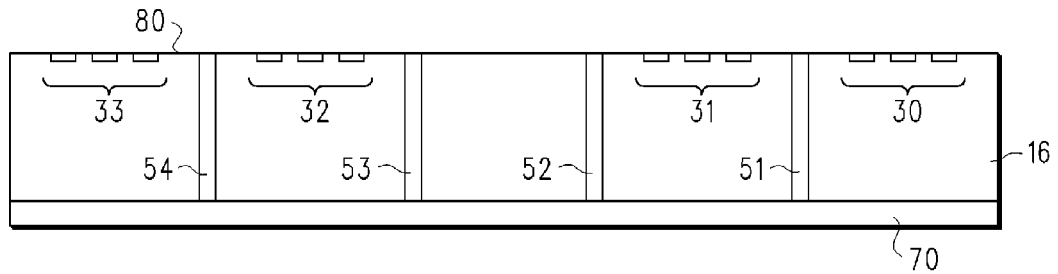
FIG. 8a illustrates processing subsequent to FIG. 7 with a cross-sectional view of the encapsulated plurality of chip modules after the double-sided tape and process carrier is removed.

After forming the conductive/shielding layer to fill the via openings 41-44 and cover the insulating package body 16, the encapsulated modules are separated or released from the removable attachment device 12 and process carrier 10. This is illustrated in FIG. 8*a* depicts the processing subsequent to FIG. 7 with a cross-sectional view of the encapsulated plurality of chip modules 30-33 after the removable attachment device 12 and process carrier 10 are removed. As depicted in FIG. 8*a*, the panel of encapsulated modules is turned upside down so that the shielding cover layer 70 is now on the bottom, and the shielding via structures 51-54 and plurality of chip modules 30-33 are exposed on the top of the insulating package body 16. In this position, a multi-layer circuit substrate structure may be built up over the panel of encapsulated modules, where the circuit substrate structure includes shielding via structures that are formed with conductive and/or shielding material to completely surround the individual circuit module(s). For example, the multi-layer circuit substrate structure may be fabricated one layer at a time to include a circuit substrate shielding via structures formed of a conductive/shielding material. By properly positioning the circuit substrate via structures so that they are electrically connected to the exposed shielding via structures 51-54 formed in the insulating package body 16, individual circuit module(s) may be enclosed and shielded by the shielding via structures. As a result, each individual encapsulated module 30-33 has one or more shielding via ring structures formed in the insulating package body 16 to encircle and shield the circuit module, and also has one or more circuit substrate via structures formed in the multi-layer circuit substrate that also encircle and shield the circuit module. As described herein, a "via structure" or "via ring structure" refers to a single "through via" and to any combination of conductive paths (e.g., grounding pad structures, embedded grounding frames, micro pads, traces, etc.) that together form a shielding structure.

Figure 8B:
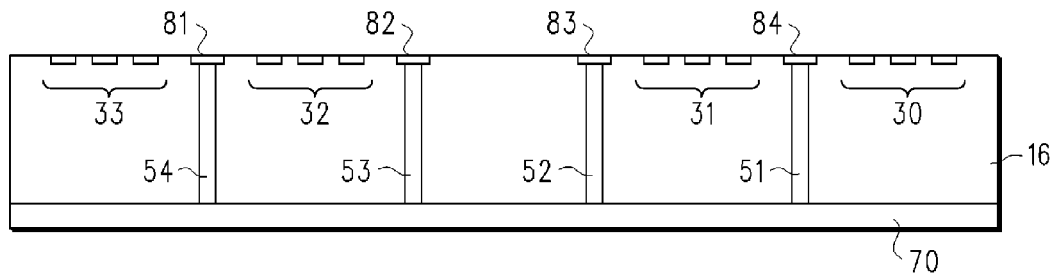
FIG. 8b illustrates a cross sectional view of an alternative embodiment of an encapsulated plurality of chip modules after the double-sided tape and process carrier is removed, where the encapsulated plurality of chip modules are formed with a grounding frame in place before the shielding via structures are formed in the molding compound.

As indicated above, the encapsulated plurality of chips may be constructed to include embedded grounding frame layers 6-9 formed in the insulating package body 16 (shown with dashed lines in FIG. 1) to facilitate the formation of circuit substrate shielding vias in alignment with the shielding via structures 51-54. An example is shown in FIG. 8*b* which illustrates a cross sectional view of an alternative embodiment of an encapsulated plurality of chip modules 30-33 where the encapsulated plurality of chip modules 30-33 are formed with a grounding frame layers 6-9 in place before the shielding via structures 51-54 are formed in the insulating package body 16. In this case, any cutting process used to form the via openings 41-44 will be controlled to stop before cutting through the grounding frame layers 6-9. FIG. 8*b* shows that, after the double-sided tape 12 and process carrier 10 are removed, the embedded grounding frame layers 6-9 present a larger connection surface on which the subsequently-formed circuit substrate shielding vias can be formed with enhanced precision. Another benefit of including embedded grounding frame layers 6-9 with a larger connection surface is that the shielding via structures formed around individual modules can be constructed as multi-via ring structures for enhanced shielding. For example, a plurality of concentric shielding via ring structures in the insulating package boy 16 may be formed around each module to provide additional shielding against electromagnetic interference.

Figure 9:
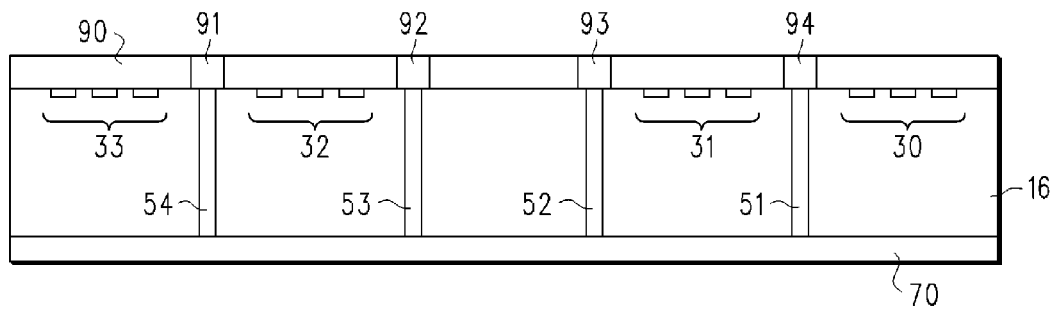
FIG. 9 illustrates processing subsequent to FIG. 8a with a cross-sectional view of the encapsulated plurality of chip modules after micro vias are formed on the backside of the encapsulated plurality of chip modules and in alignment with the shielding via structures.

While any desired fabrication sequence may be used to form the multi-layer circuit substrate, an example sequence is illustrated beginning with FIG. 9 which illustrates processing subsequent to FIG. 8*a* with a cross-sectional view of the encapsulated plurality of chip modules 30-33 after micro vias 91-94 are formed on the backside of the encapsulated plurality of chip modules and in alignment with the shielding via structures 51-54. The individual micro vias may be fabricated by forming an insulating layer 90 with openings over at least the shielding via structures 51-54, and then depositing, sputtering or otherwise forming a conductive and/or shielding material in the openings to form the micro vias 91-94. The insulating layer 90 may be formed by applying a patterned adhesive layer of insulating material, by depositing a layer that is then selectively etched, or using any desired technique. Alternatively, the micro vias 91-94 may be formed by applying a patterned adhesive layer of conductive/shielding material, by depositing a conductive/shielding layer that is then selectively etched, or using any desired technique. Though not shown, it will be appreciated that the insulating layer 90 may also have openings over the individual circuit module(s) to permit electrical connection to any signal lines or supply voltage lines in the circuit module(s). In this way, each microelectronic device in the chip module may be mounted or attached to the circuit substrate using surface mount techniques, including, but not limited to wire bond, tape-automated bond, solder ball connectors, flip-chip bonding, etc. For example, each microelectronic device may have die bond pads (not shown) which are electrically connected to landing pads (not shown) on the circuit substrate, such as by using wire bonds.

Figure 10:
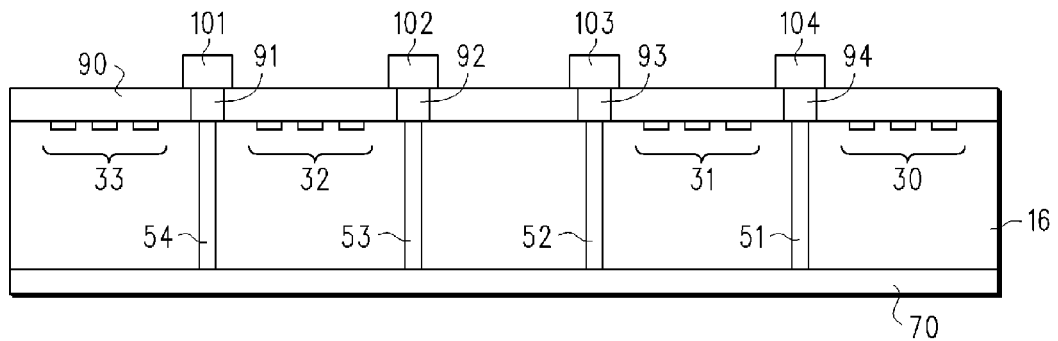
FIG. 10 illustrates processing subsequent to FIG. 9 with a cross-sectional view of the encapsulated plurality of chip modules after micro pads are formed in alignment with the micro vias formed on the backside of the encapsulated plurality of chip modules.

Additional layers of the multi-layer circuit substrate may then formed over the first insulating layer 90 and micro vias 91-94 to construct the circuit substrate shielding vias. For example, FIG. 10 illustrates processing subsequent to FIG. 9 with a cross-sectional view of the encapsulated plurality of chip modules 30-33 after micro pads 101-104 are formed in alignment with the micro vias 91-94 formed on the backside of the encapsulated plurality of chip modules. The individual micro pads 101-104 may be fabricated by forming an insulating layer (not shown) with openings over at least the micro vias 91-94 and then depositing, sputtering or otherwise forming a conductive and/or shielding material in the openings to form the micro pads 101-104; by applying a patterned adhesive layer of conductive/shielding material; by depositing a conductive/shielding layer that is then selectively etched; or using any desired technique.

Figure 11:
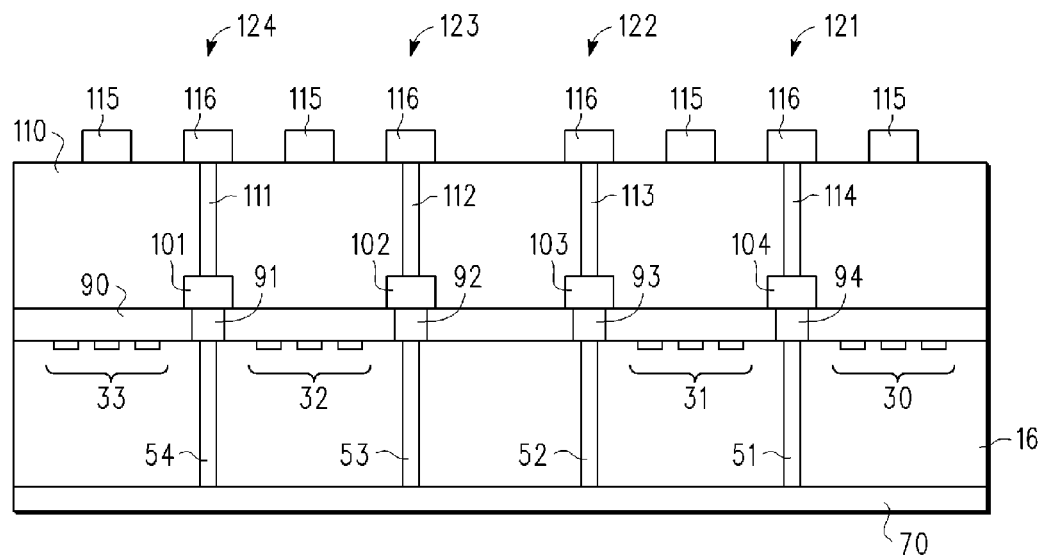
FIG. 11 illustrates processing subsequent to FIG. 10 with a cross-sectional view of the encapsulated plurality of chip modules after a multilayer substrate is formed with shielding via structures which are electrically connected to the shielding via structures formed in the molding compound.

As the multi-layer circuit substrate continues to be built up, circuit substrate shielding via structures 121-124 are formed in substantial alignment with the shielding via structures 51-54. An example process is shown in FIG. 11 which illustrates processing subsequent to FIG. 10 with a cross-sectional view of the encapsulated plurality of chip modules 30-33 after a multilayer substrate 110 is formed with via structures 111-114 that are formed in alignment with the micro pads 101-104. Again, the via structures 111-114 may be fabricated from one or more conductive/shielding layers that are formed over at least the micro pads 101-104 using any desired technique. However formed, the via structures 121-124 are electrically connected to the shielding via structures 51-54 formed in the insulating package body 16. The circuit substrate 110 also includes conductive paths (not shown) to electrically couple signals and/or voltages to and from the chip module. Thus, the circuit substrate 110 may be formed to any desired shape and thickness, and may include any desired features for use in forming a functional semiconductor package. In addition, the circuit substrate 110 may be fabricated with any desired material, such as a relatively thin, flexible film of an electrically insulative material (such as an organic polymer resin), or a rigid, substantially planar member fabricated from any known, suitable materials, including, but not limited to, insulator-coated silicon, a glass, a ceramic, an epoxy resin, bismaleimide-triazine (BT) resin, or any other material known in the art to be suitable for use as a circuit substrate.

The finally completed panel may have formed on the circuit substrate one or more I/O pads. As shown in simplified schematic form in FIG. 11, supply voltage and signal I/O pads 115 may be formed so that they can be electrically connected through the multi-layer circuit substrate to the respective chip modules 30-33. In addition, reference voltage pads 116 may be formed so that they can be electrically connected to the via structures 111-114 in the multi-layer circuit substrate, and in turn to the shielding via ring structures 51-54 and shielding cover layer 70.

At this point when the multi-layer circuit is constructed, a conductive/shielding coating may be applied to any exposed surface of the insulating package body 16, such as by depositing a metal film, conductive polymer, etc. For example, the conductive shielding replacement layer described above with reference to FIG. 7 may instead be formed after the multi-layer circuit substrate is formed.

Figure 12:
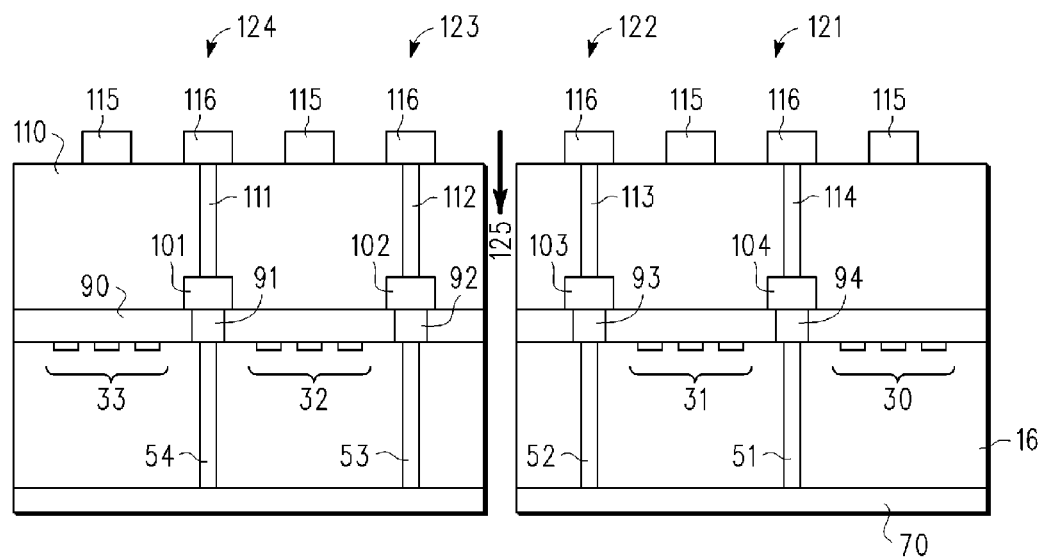
FIG. 12 illustrates processing subsequent to FIG. 11 with a cross-sectional view of the encapsulated plurality of chip modules after individual chip modules are singulated.

Once the multi-layer circuit substrate panel is completed, the panel is cut, sawed, or otherwise separate into singulated dice. FIG. 12 illustrates processing subsequent to FIG. 11 with a cross-sectional view of the encapsulated plurality of chip modules 30-33 after individual chip modules are singulated by sawing through predetermined cut paths, thereby forming chip modules in which shielding via structures are formed to shield individual circuit devices. As depicted in FIG. 12, a cut line 125 that is positioned between a first shielding via structure 53, 92, 102, 112 and a second shielding via structure 52, 93, 103, 113 separates the panel into a first chip module (including circuit devices 30 and 31) and a second chip module (including circuit devices 32 and 33), where each circuit device is individually shielded by the shielding via structures formed in the circuit substrate and insulating package body 16. By positioning the cut line 125 between the shielding structures, the chip module(s) 32 is shielded by the shielding via ring structures 53, 54 and the shielding via structures 111, 112. Likewise, the chip module(s) 31 is shielded by the shielding via ring structures 51, 52 and the shielding via structures 113, 114. Though FIG. 12 shows only a single shielding structure 54, 101 next to the chip module(s) 33, it will be appreciated that additional shielding structures (not shown) may be formed to encircle and shield the module(s) 33.

Figure 13:
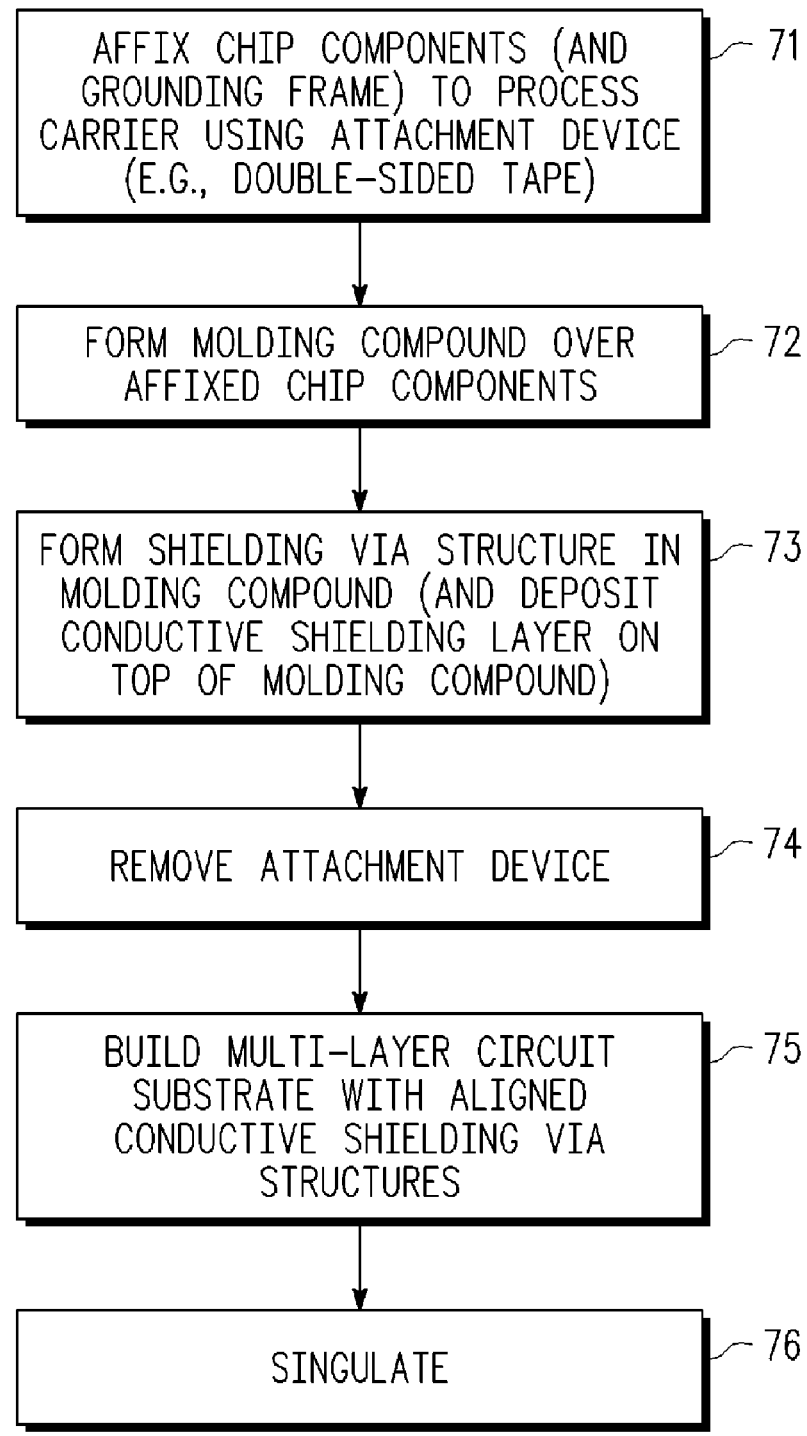
FIG. 13 illustrates a sample fabrication sequence flow for fabricating chip modules with a conformal EMI shielding.

Turning now to FIG. 13, there is illustrated a sample fabrication sequence flow for fabricating chip modules with a conformal EMI shielding. As an initial step 71, a plurality of chip modules/components are mounted or affixed on the surface of a process carrier using a releasable attachment device, such as a double sided tape layer or glue layer. With the chip modules/components assembled on the attachment device, a molding compound is formed to encapsulate the chip modules/components (step 72). Shielding via structures are then formed in the molding compound by cutting down through at least the molding compound to form via openings, and then filling the via openings with a conductive or shielding material, such as by depositing a conductive material over the molding compound and into the via openings (step 73) using any desired technique, such as plating, sputtering, spraying, etc. If the molding compound is thinned at this point, a replacement layer of conductive or shielding material must subsequently be formed on the top of the molding compound. Once the shielding via structures are formed in the molding compound, the removable attachment device is released (step 74), and a multi-layer circuit substrate is then built on the encapsulated chip modules/components (74). The multi-layer circuit substrate is formed to include conductive shielding via structures that are aligned with and electrically coupled to the shielding via structures formed in the molding compound, so that individual circuit devices or components are surrounded and shielded by the shielding via structures. Finally, the individual chip modules are cleaned and separated from one another (step 76).

In one form, there is provided herein a method for making a package assembly with conformal EMI shielding. As disclosed, a plurality of microelectronic devices (such as circuit devices, grounding frames, etc.) are attached to a releasable attachment device (such as a double-sided tape or glue layer) and encapsulated by forming a molding compound or resin over the microelectronic devices to form an encapsulation package having a first surface that contacts the releasable attachment device and a second surface opposite the first surface. Via openings are formed in the encapsulation package to surround an encapsulated microelectronic circuit, such as by cutting through the second surface of the encapsulation package by performing a saw or laser cut. The via openings are then at least partially filled with a conductive layer to form a shielding via ring structure surrounding the encapsulated microelectronic circuit. After removing the removable attachment device from the first surface of the encapsulation package, the encapsulated microelectronic circuit is exposed at the first surface of the encapsulation package, and a circuit substrate is then formed on that surface. The circuit substrate may be formed as a multi-layer circuit substrate having shielding via structure which is substantially aligned with and electrically connected to the shielding via ring structure formed in the encapsulation package. In various embodiments, the shielding via structure formed in the circuit substrate is formed from one or more conductive layers, such as a micro via layer, a micro pad layer, a grounding pad, an embedded grounding frame, a trace layer that are electrically connected to the shielding via ring structure.

In another form, there is provided a high density RF (radio frequency) module package having an encapsulant package formed to encapsulate one or more microelectronic circuits so as to expose the one or more microelectronic circuits at a bottom surface of the encapsulant package. In the encapsulant package, one or more shielding via ring structures are formed to shield each of the microelectronic circuits against electromagnetic interference. In various embodiments, the shielding via ring structures are formed with conductive (e.g., metal or polymer) material that completely covers a top surface of the encapsulant package and at least partially fills one or more via openings drilled into the encapsulant package before the circuit substrate is formed. As formed, the encapsulant package may also include an embedded ground frame which is exposed at the bottom surface of the encapsulant package and positioned in alignment with a shielding via ring structure. The package also includes a circuit substrate which is formed on the bottom surface of the encapsulant package after forming the first shielding via ring structure. The circuit substrate may be formed as a multi-layer circuit substrate having a shielding via structure which is substantially aligned with and electrically connected to the shielding via ring structure formed in the encapsulant package. The shielding via structure may be formed with one or more conductive layers in the circuit substrate, such as a micro via layer, a micro pad layer, a grounding pad, an embedded grounding frame, or a trace layer that is electrically connected to the shielding via ring structure.

In yet another form, there is provided a method of forming a semiconductor package wherein a package panel is provided that includes a plurality of circuit devices that are releasably attached to a process carrier and encapsulated with an encapsulation package so as to expose the one or more circuit devices at a bottom surface of the encapsulation package. In an example embodiment, the package panel is provided by providing a process carrier that is releasably attached to a plurality of circuit devices (and optionally, a ground frame) with a double-sided tape layer or glue layer, and then encapsulating the plurality of circuit devices (and ground frame) with a mold encapsulant to form an encapsulation package. One or more shielding via ring structures may be formed in the encapsulation package to surround a first encapsulated circuit device by drilling through a top surface of the encapsulation package (e.g., with a laser cut) to form via openings surrounding the first encapsulated circuit device, and then forming a conductive layer over the encapsulation package and in the via openings. After removing the process carrier from the bottom surface of the encapsulation package, the first encapsulated circuit device is exposed at the first surface of the encapsulation package. On this exposed bottom surface, a circuit substrate is formed, such as by forming a multi-layer circuit substrate having shielding via structure which is substantially aligned with and electrically connected to the shielding via ring structure formed in the encapsulation package. In various embodiments, the shielding via structure is formed with one or more conductive layers formed in the multi-layer circuit substrate, such as a micro via layer, a micro pad layer, a grounding pad, an embedded grounding frame, or a trace layer that is electrically connected to the shielding via ring structure. Subsequently, the first encapsulated circuit device and its shielding via ring structure may be singulated, such as by sawing or cutting.

FIGS. 14-19 set forth partial side views of various stages in making an integrated circuit package (chip module) with electromagnetic shielding according to another embodiment.

Figure 14:
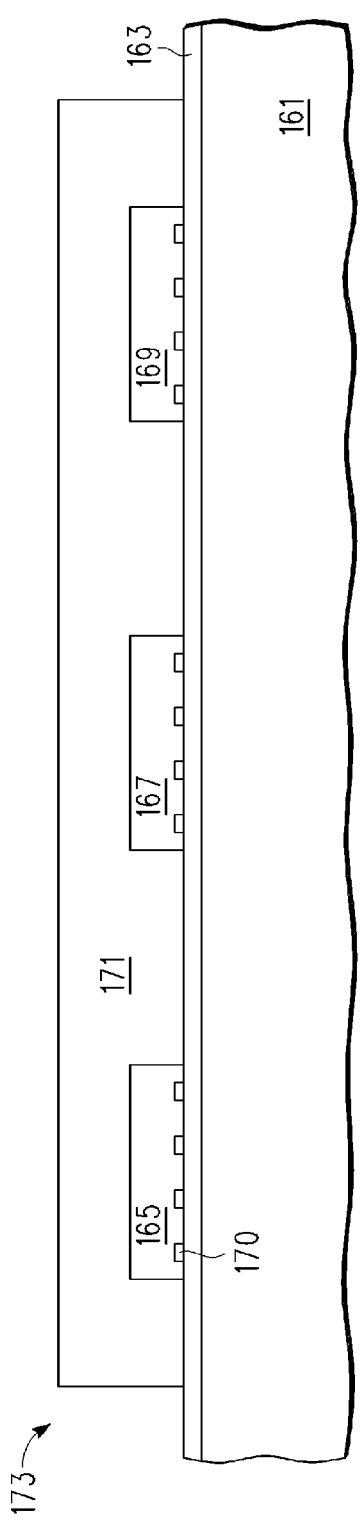

FIG. 14 is a side cutaway view of a carrier 161 with integrated circuit die 165, 167, 169 attached with a layer of adhesive 163. In one embodiment, die 165, 167, and 169 are integrated circuit die formed from a wafer of semiconductor material that has been singulated into individual semiconductor die. The integrated circuit die may include a number of transistors and other devices formed on an active layer of semiconductor material. Interconnect layers of dielectric material and conductive interconnects are formed over the semiconductor devices to interconnect the devices and for coupling to external devices by external conductors (e.g. bond pad 170). In one embodiment, die 165, 167, and 169 have similar designs. However, in other embodiments, they may each be of different designs.

In one embodiment, die 165, 167, and 169 include digital logic or microprocessor circuitry (e.g. CPU, controller, base band processor). Such die may need to operate free of electromagnetic interference. In other embodiments, die 165, 167, and 169 may include analog or radio frequency (RF) transmitting circuitry (RF transceiver, power management circuitry, power amplifier) whose operation may interfere with other circuitry (e.g. digital circuitry) of a system incorporating the die.

In one embodiment, adhesive layer 163 is a layer of adhesive material. In other embodiments, layer 163 may be double sided tape. In the embodiment shown, structure 173 includes three die. In other embodiments, encapsulated structure 173 may include more die including die arranged in a two dimensional grid. In other embodiments, structure 173 may include other types of circuit devices located on adhesive layer 163.

After the die are placed on layer 163 with the active side down (where the bond pads (e.g. 170) are facing layer 163), the die are encapsulated with dielectric material (e.g. plastic molding, epoxy, resin, or other dielectric material) to form encapsulated structure 173. In one embodiment, the material of layer 171 is applied by a squeegee or a compression molding process.

After the stage shown in FIG. 14, carrier 161 is separated from encapsulated structure 173, wherein adhesive layer 163 is removed from structure 173.

Figure 15:
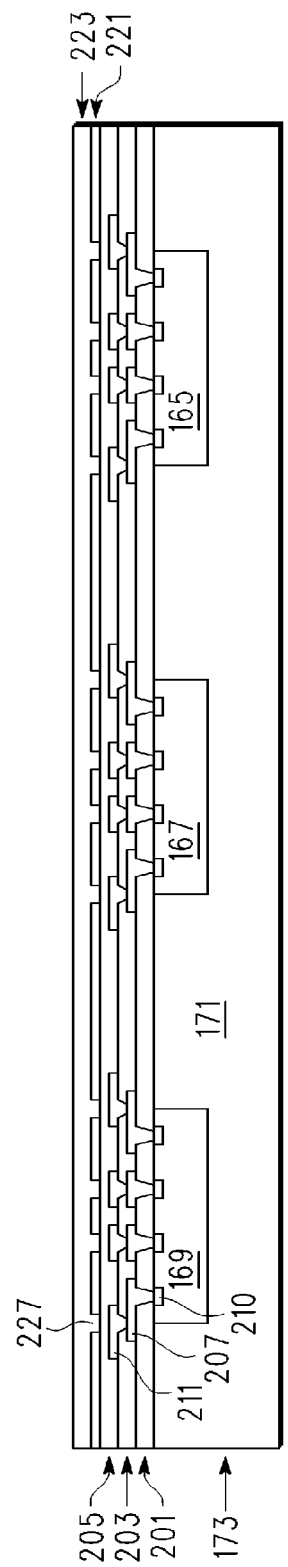

FIG. 15 shows a side cross-sectional view of structure 173 after structure 173 has been flipped over and subsequent processing is performed on structure 173 to form a layered redistribution structure including electrical interconnect structures and interlayer dielectric materials.

In the embodiment shown, dielectric layers 201, 203, and 205 are formed over structure 173. In one embodiment, these dielectric layer are formed of a material such as TEOS. During the process for forming the these layers, micro vias are formed in the layers wherein conductive material (e.g. copper, aluminum, gold) is deposited in the vias and over remaining portions of the dielectric layer. The layer of conductive material is then patterned to form the conductive interconnects (e.g. interconnect 207). After formation of the first layer of interconnects (the layer with interconnect 207) a second dielectric layer 203 is formed over the layer. That layer is then patterned to form vias exposing the conductive interconnects of the previous layer. These vias are then filled with conductive material and then patterned to form the second layer of electrical interconnects (e.g. electrical interconnect 211). Afterwards, a subsequent layer of dielectric material 205 is formed there over.

In some embodiments, the conductive interconnects may be formed by depositing the layer of conductive material on the encapsulated structure, patterning the layer of conductive material, forming a layer of dielectric material over the structure including over the patterned conductive structures, and then planarizing the structure wherein the conductive structures are exposed.

After the formation of layer 205, a layer 221 of shielding material (e.g. copper) is formed over layer 205. In one embodiment, layer 221 has a thickness of 10 μm, but may have other thicknesses in other embodiments.

After the formation of layer 221, the layer is then etched to form openings (e.g. openings 227) for subsequent formation of solder balls or other external conductors. A dielectric layer 223 is formed over layer 221. In one embodiment, layer 223 is subsequently utilized as a solder mask.

Figure 29:
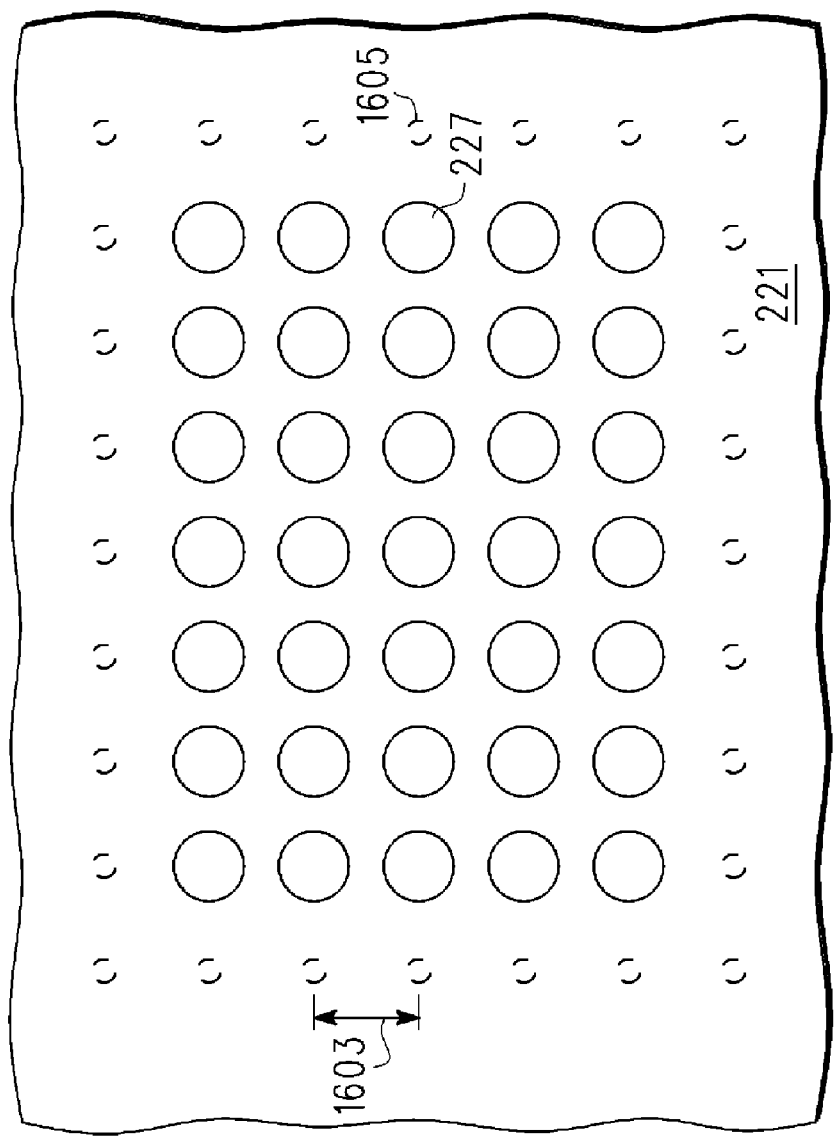
FIG. 29 is a partial top view of the embodiment of the work product FIGS. 14-19.

FIG. 29 shows a top view of a portion of layer 221 over die 169 (not shown in FIG. 29). In the embodiment shown, openings 227 are surrounded by outer locations 1605. The outer locations represent the locations of subsequently formed conductive vias formed through layers 171, 201, 203, 205, 221 for electromagnetic shielding. The openings 227 are at locations of subsequently formed solder balls for coupling to the signal and power signals of die 169.

In the embodiment shown, the openings have a predetermined pitch that correspond to the pitch of external electrical connectors the final package. In one embodiment, the distance separating the locations 1605 of the subsequently formed conductive vias are of a distance that is ¼ the wavelength of the smallest electromagnetic wavelength of which shielding is desired. In other embodiments, spacing would be determined by the operating frequency and shielding requirements of circuitry of the package. For example, if die 169 includes an RF transceiver for a broadcast frequency of 2 GHz, then the spacing between the subsequently formed conductive vias may range from 0.1- 0.5 mm. However, other spacings may be utilized in other embodiments.

Although not shown, each die of structure 173 would include an opening pattern similar to that shown in FIG. 29. In other embodiments having different types of die or other devices, the opening pattern would be different depending on the device being encapsulated.

FIG. 16 shows a cutaway side view of the structure of FIG. 15 that is flipped over with subsequent layers formed on the other side. In FIG. 16, dielectric layer 301 is formed on the backside of layer 171. In some embodiments, dielectric layer 301 is made of a polymer dielectric material such as photo imagable epoxy. A layer 303 of shielding material (e.g. copper) is then formed on layer 301. In one embodiment, layer 303 has a thickness in the range of 1-10 μm, but may have other thicknesses in other embodiments. Afterwards another dielectric layer 305 is formed over layer 303. In one embodiment, layer 305 is also a polymer dielectric material. In some embodiments, layer 171 may be thinned prior to the formation of layer 301.

FIG. 17 shows a view of the structure after it has been flipped over again and via openings are formed from one side of the structure to expose layer 303. In one embodiment, these via openings 401, 403, 405, 407, 409, and 411 are located at locations around the perimeters of each die. In some embodiments, these openings may surround multiple die. Referring to FIG. 29, these vias (e.g. 401, 405) would be located at locations 1605. In one embodiment, these via openings are formed by laser drilling, but may be formed by chemical etch, mechanical drilling, or saw in other embodiments. In one embodiment, these vias may be trenches located on each side of an integrated circuit die. Still in other embodiments, these vias may be formed by etching the material. In other embodiments, these vias may have a "V" shaped profile.

Figure 18:
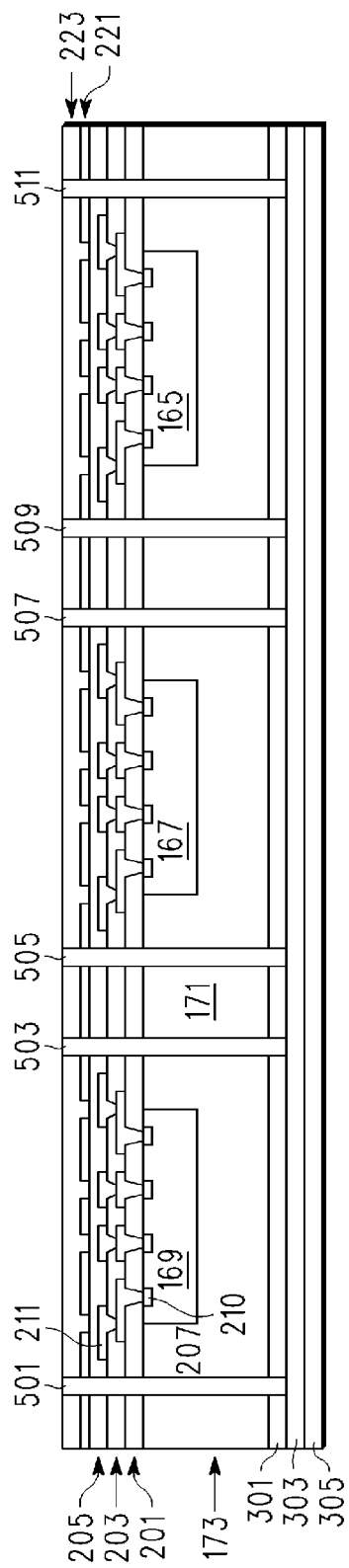

FIG. 18 shows a cross sectional view after the via openings 401, 403, 405, 407, 409, and 411 are filled with conductive material (e.g. copper, silver, gold) to form conductive shielding vias 501, 503, 505, 507, 509, and 511. In one embodiment, the openings are filled by forced injection. In other embodiments, the vias may be filled by electroplating.

Figure 19:
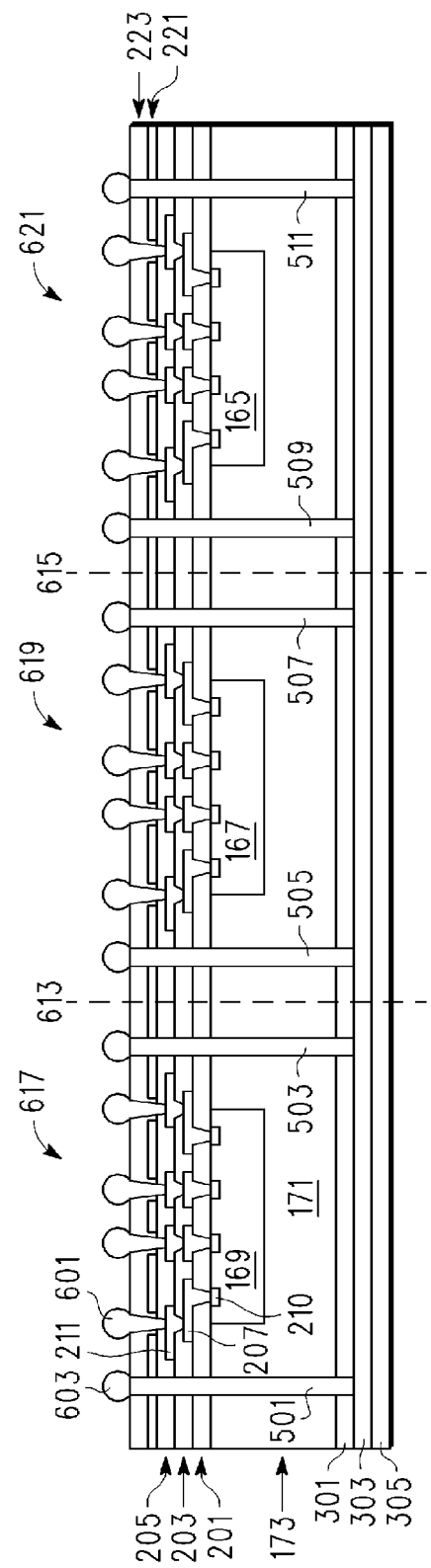

FIG. 19 shows a view of the resulting structure after solder balls (e.g. 601) are formed. In one embodiment, solder balls are formed by forming openings at the desired location in layer 223. The solder balls formed on the perimeter of each die (e.g. 603) are formed to be electrically connected to each electrically conductive via e.g. 501 where each conductive via would include a corresponding solder ball. The solder balls (e.g. 603) located on the perimeter of each die would electrically contact layer 221 and would be electrically coupled to shielding layer 303 by the conductive vias (e.g. 501). In other embodiments, the number of solder balls located around the perimeter (e.g. solder ball 603) of a die would not necessary correspond to the number or location of shielding conductive vias (e.g. 501). In these embodiments, the solder balls may be in electrical contact with layer 221 at different locations.

The solder balls (e.g. 601) located interior to the perimeter solder balls (e.g. 603) would not be electrically coupled to layer 221. Instead they would be electrically coupled to corresponding electrical interconnects (e.g. 211) located between layers 205, 203, and 201.

The resultant structure is then singulated at lines 613 and 615 to form three packaged integrated circuits 617, 619, and 621, each with an integrated circuit die in a electromagnetic shield Faraday cage. For example, integrated circuit package 617 includes die 169 located in a Faraday cage that includes a portion of layer 221, a portion of layer 303 and conductive vias (e.g. vias 501 and 503) electrically coupling the two layers at various locations around die 169.

In the embodiment shown, each package (e.g. 617) includes only one die. However, in other embodiments (including embodiments subsequently described above and below), other packages may include multiple die. In some embodiments, each die of an integrated circuit package would be surrounded by its own Faraday cage. However, in other embodiments, multiple die would be surrounded by a single Faraday cage. In some embodiments, some of the die of a package would be surrounded by a Faraday cage where other die would not be. In some embodiments, conductive interconnects would be located between layers 201 and 203 and between layers 203 and 205 that would carry signals between integrated circuit die of a package located on opposite sides of a Faraday cage. Such conductive interconnects would be routed between the perimeter conductive vias (e.g. 501).

In one embodiment, providing an electromagnetic shield including layers and structures formed after the encapsulation of a die in a package encapsulant may provide for a flexible method of forming integrated circuit packages. With the processes described herein, the shield can be formed by post encapsulating processing without having to make prefabricated structures that are subsequently attached. Accordingly, such a process may be more economically feasible. With prior art packages, Faraday cages in integrated circuit packages are implemented with prefabricated cage structures that are placed around the die and then encapsulated. Such prior art packages require equipment for placing such structures in relation to the die and then securing such structures in that relation to the die such that the encapsulation process does not move the cage structure with respect to the die. Also, electrically interconnecting different die of a package where prefabricated structures are used is more difficult. In addition, the shielding structure described herein can be formed during the formation of the layered redistribution structure.

With the embodiments describe above, the Faraday cage structures are made post die encapsulation, thereby avoiding problems associated with cage structure movement.

Figure 22:
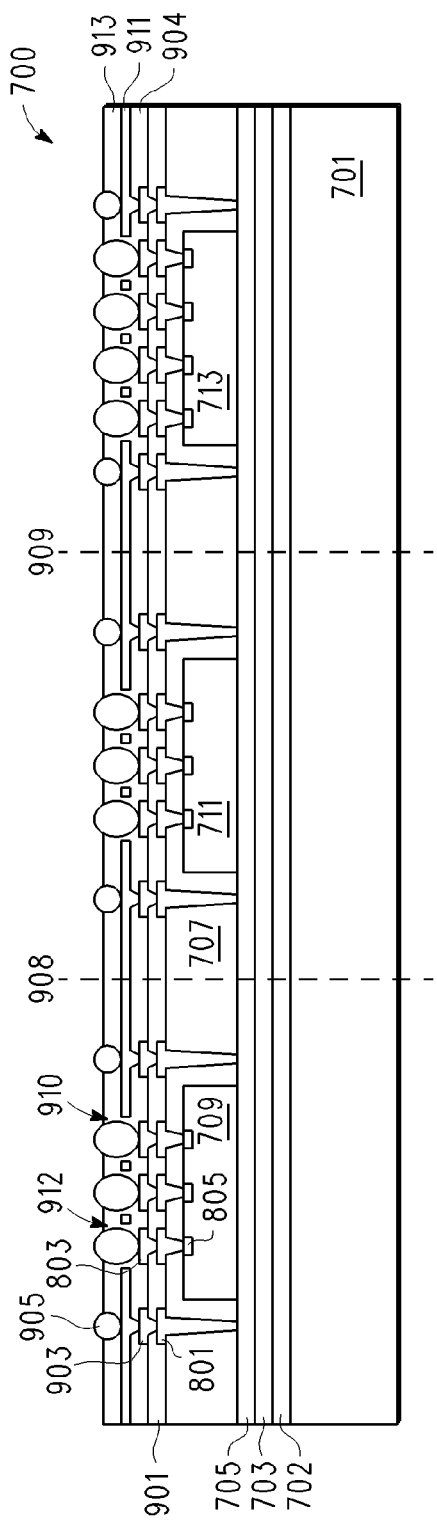

FIGS. 20-22 show another embodiment for the formation of integrated circuit packages with electromagnetic shields having structures formed post encapsulation of the die.

In FIG. 20, structure 700 includes a dielectric layer 703 (e.g. photo imagable epoxy) formed on adhesive structure 702. Adhesive structure 702 is located on carrier 701. A shielding layer 705 (e.g. copper, gold, silver, platinum) is formed on dielectric layer 703. In one embodiment, layer 705 is formed by a seeding process and subsequent electroplating process. In one embodiment, layer 705 is 10 microns thick, but may be other thicknesses in other embodiments.

In one embodiments, die 709, 711, and 713 are attached to layer 705 e.g.

with adhesive (not shown) either placed on the die or on layer 705. The die are then encapsulated in a layer 707 of dielectric material. In one embodiment, die 709, 711, and 713 are placed active side up on layer 705 followed by the application of film dielectric layer 707. In one embodiment, layer 707 is a film dielectric applied as a sheet over the die. The sheet may have pockets for each of the die. The structure is cured at an elevated temperature (e.g. 150-170 Centigrade) where the material of the film reforms around the die to encapsulate the die. In one embodiment, the film is made of photo imagable polymer epoxy, but may be made of other materials in other embodiments. Layer 707 maybe thinned at this time (e.g. by grinding or polishing).

FIG. 21 shows structure 700 after the formation of conductive via structures through layer 707. In the embodiment shown, conductive vias (e.g. vias 801) are located around the perimeter of each die. These vias are formed by forming openings to expose layer 705. Other openings are formed to expose the bond pads (e.g. 805) of the die. In one embodiment, these openings are formed by etching layer 707 with a suitable etchant. The openings are then filled with a layer of conductive material that is then patterned to form the conductive structures.

Referring to FIG. 22, additional structures are formed on structure 700. A layer of dielectric material 901 is formed on structure 700. Afterwards, openings are formed in layer 901 to expose the electrically conductive structures including the electrically conductive structures around each die. A layer of conductive material is formed over layer 901 and then patterned to form the conductive structures (e.g. 903). A subsequent dielectric layer 907 is then formed over the second layer of conductive structures.

A layer 911 of shielding material is then formed over structure 700. Layer 911 is then patterned to form openings for subsequently formed solder balls.

In some embodiments, prior to forming layer 911, layer 907 is selectively etched to expose the conductive structures (e.g. 903) of the second layer of conductive structures located around each die. Layer 907 is then formed to electrically contact these structures. Accordingly, the electrically conductive structures around each vias (e.g. 903, 801) are each electrically coupled to layer 911 (and also electrically coupled to layer 705) to form a Faraday cage around each die. In one embodiment, each of the perimeter conductive structures (e.g. vias 903 and 801) located around each die form a multiple layer via that is spaced apart by other such vias by ¼ the wavelength of the smallest electromagnetic wavelength of which shielding is desired. In other embodiments, the conductive structures may be spaced apart by a distance in the range of 100-500 μm. Still in other embodiments, other spacings may be utilized. In one embodiment, vias 801 may be trenches located around each die (e.g. die 709) or circuit block in some embodiments.

Layer 911 is then patterned to form openings (e.g. 910 and 912) for the subsequent location of solder balls. After patterning layer 911, dielectric layer 913 is formed there over, wherein the dielectric material fills the openings 910 and 912.

Afterwards, solder balls are formed on structure 700 by forming openings in layer 913 and forming conductive material in the openings. For solder balls not electrically coupled to layer 911, the openings are also formed through the openings (e.g. 910, 912) in layer 911. The solder balls electrically coupled to layer 911 may be located at the location of the shielding vias (e.g. formed of vias 903 and 801) or maybe located at different locations and at different pitches. In some embodiments, other types of conductive structures may be formed in openings 910 and 912 for electrically coupling to integrated circuit die. Solder balls or other types of external electrical connectors would be electrically connected to these structures. These structures would be isolated from layer 911.

After the formation of solder balls, carrier 701 is removed from structure 700. Structure 700 is then singulated at locations 908 and 909 into integrated circuit packages 921, 923, and 925.

In the embodiment shown, structure 700 includes two layers of conductive structures (e.g. the layer of via 801 and via 903). In other embodiments, other structures may include a different number of conductive structures.

In one embodiment, the structures of FIGS. 20-22 provide integrated circuit packages that can be formed without flipping over the encapsulated structure and without drilling via holes. By not flipping over the encapsulated structure, structure 700 can remain on carrier 701 throughout the process. In another embodiment, a conductive ground plane (not shown) may be attached to layer 705 and be part of the encapsulated structure 700. In this embodiment, shielding vias 801 would electrically contact the ground plane.

Figure 23:
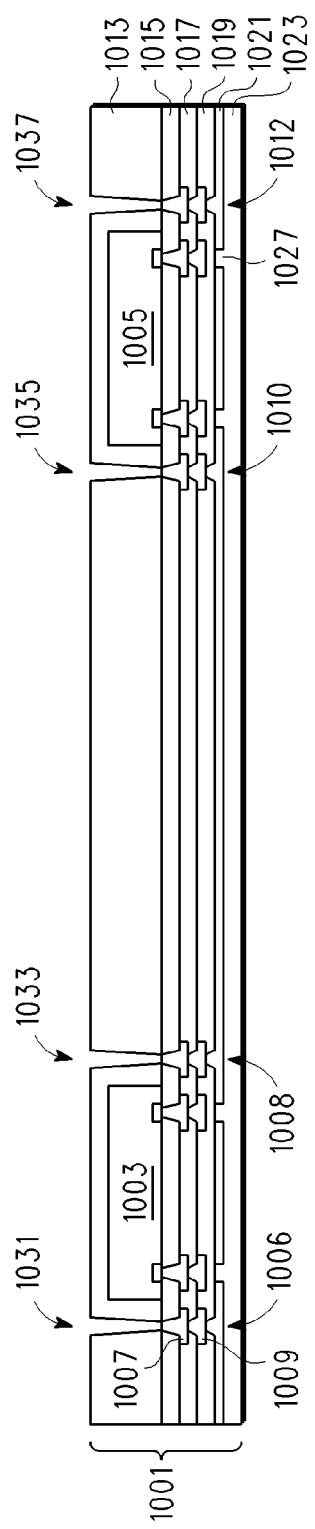
FIGS. 23-24 are side cutaway views of a various stages in the manufacture of integrated circuit packages according to another embodiment of the present invention.
Figure 24:
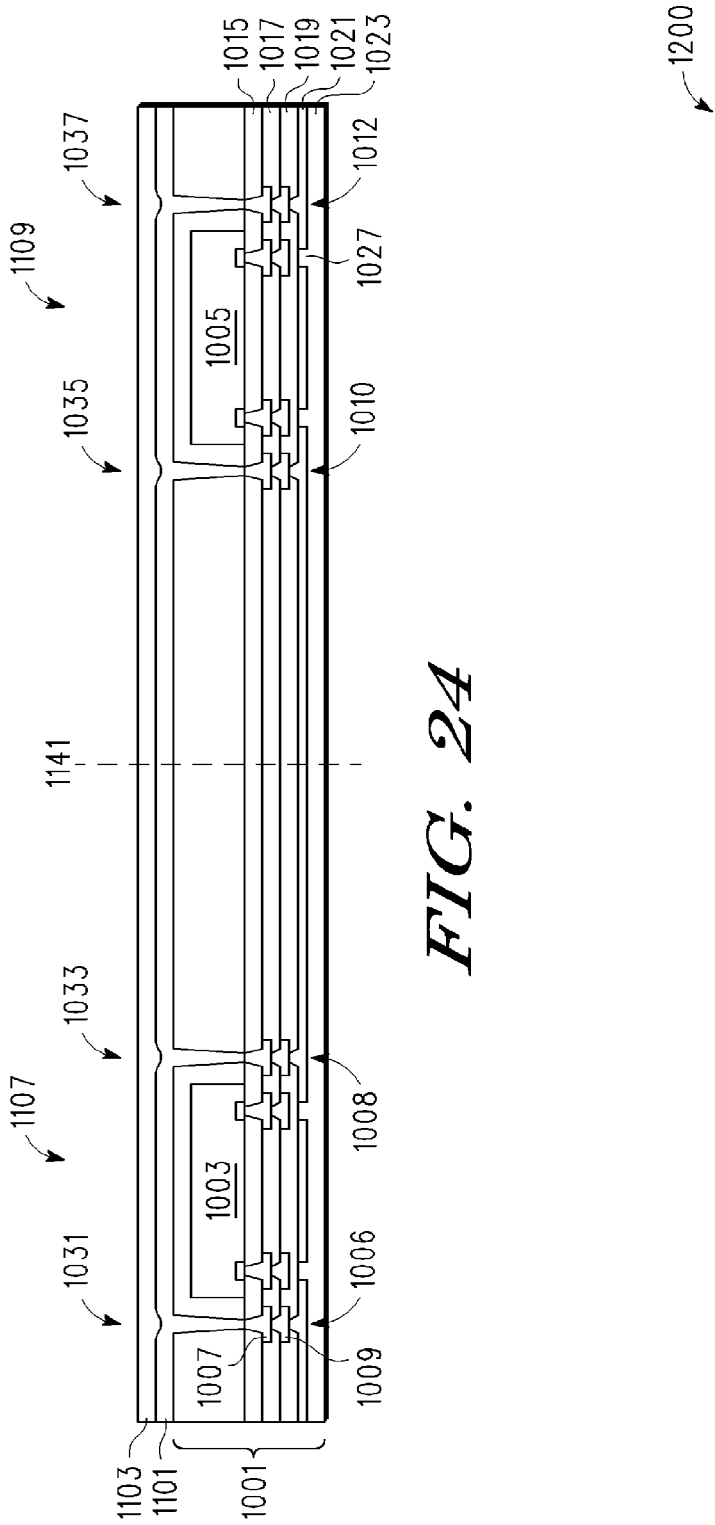

FIGS. 23 and 24 show stages of another embodiment for forming shielding in an integrated circuit package. In the embodiment of FIGS. 23 and 24, conductive shielding vias are formed with multiple layers of conductive structures.

In FIG. 23, a structure 1001 is formed with die 1003 and 1005 encapsulated with dielectric layer 1013. During the initial formation of structure 1001, structure 1001 is positioned up side down from its position shown in FIG. 23. Structure 1001 is formed in a similar manner to the structure in FIG. 15 except that shielding conductive vias 1006, 1008, 1010, and 1012 are formed with multiple layers of conductive micro vias along with the conductive structures electrically coupled to the bond pads of die 1003 and 1005. In the embodiment shown, the conductive structures (e.g. structure 1007) of the shielding vias are formed by forming an opening in dielectric layer 1015 to expose dielectric layer 1013. Structure 1001 also includes dielectric layers 1017 and 1019.

A shielding layer 1021 is formed over layer 1019. Prior to forming dielectric layer 1021, openings are formed in layer 1019 to expose the conductive structures (e.g. 1009) of the second layer of conductive structures. Accordingly, layer 1021 is in electrical contact with these conductive shielding structures.

After dielectric layer 1023 is formed over layer 1021, structure 1001 is flipped over (to its position shown in FIG. 23). In some embodiments, the thickness of layer 1013 may be reduced prior to forming openings 1031, 1033, 1035, and 1037. Openings 1031, 1033, 1035, and 1037 are formed to contact electrically conductive structures (e.g. 1007) of the shielding vias (e.g. 1006, 1008).

FIG. 24 shows structure 1001 after a conductive shield layer 1101 is formed over structure 1001 wherein the material of layer 1101 electrically contacts each of the shielding vias through openings 1031, 1033, 1035, and 1037. Afterwards, a dielectric layer 1103 is formed over shield layer 1101.

Afterwards, solder balls are formed on structure 1001 (on the bottom side relative to the view shown in FIG. 24). The solder balls are formed by forming openings through layer 1023 (and through the openings of layer 1021 where the solder balls are not coupled to the shielding structures). Structure is then singulated along line 1041 to form packages 1107 and 1109.

FIGS. 25-28 show another embodiment of forming integrated packages with electromagnetic shielding surrounding each die. In the embodiments of FIGS. 25-28, the die are encapsulated with a ground plane that is subsequently used as part of the shielding.

Figure 25:
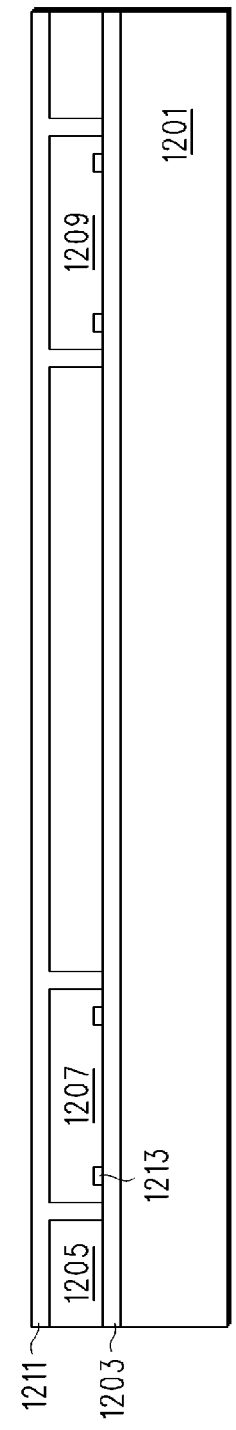
FIGS. 25-28 are side cutaway views of a various stages in the manufacture of integrated circuit packages according to another embodiment of the present invention.

FIG. 25 shows structure 1200 that is formed by attaching a ground plane 1205 to adhesive 1203 located on carrier 1201. The ground plane includes openings where die 1207 and 1209 are located active side down and where bond pads 1213 are facing downward relative to the view shown in FIG. 25. Afterwards the die and ground plane 1205 are encapsulated with dielectric material 1211 to form encapsulated structure 1200.

In one embodiment, ground plane 1205 is copper, but may be of other suitable materials in other embodiments. In one embodiment, ground plane 1205 has the same thickness as die 1207 and 1209, but may be at a different thickness than the die (either greater or smaller) in other embodiments.

Figure 26:
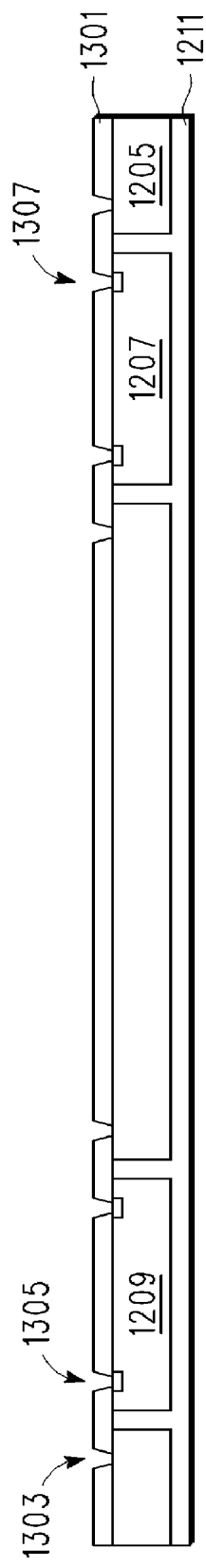

FIG. 26 shows a cross sectional view of structure 1200 after it is flipped over and layer 1301 of dielectric material is formed over structure 1200. Openings are formed in layer 1301 to expose ground plane 1205 (openings 1303) and to expose bond pads (e.g. 1213) of the die.

Figure 27:
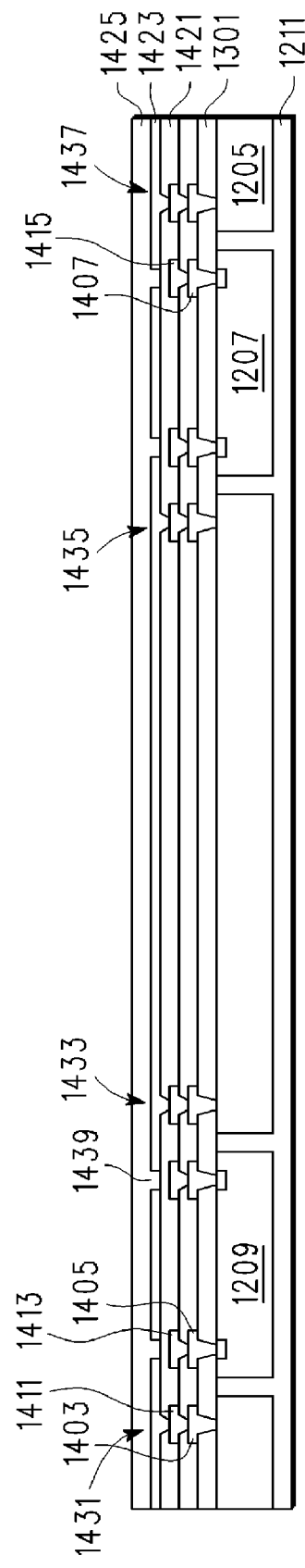

FIG. 27 shows a cross sectional side view after dielectric layers e.g. 1421) and conductive structures (e.g. 1411, 1413) are formed over structure 1200. In the embodiment shown, shielding vias 1431, 1433, 1435, and 1437 are formed around the perimeter of die 1209 and 1207. These shielding via are formed from multiple electrically conductive structures formed at the same time as the electrically conductive structures (e.g. 1413, 1405) electrically coupled to the bond pads of the die. In the embodiment shown, shielding via 1431 includes conductive structures 1403 and 1411.

Openings are formed in dielectric layer 1421 to expose conductive structures of the shielding vias. Afterwards a shielding layer 1423 is formed over structure 1200. Shielding layer 1423 is then patterned to form openings (e.g. 1439) for solder balls that are not coupled to shielding layer 1423. Afterwards, a layer of dielectric material 1425 is formed over shielding layer 1423.

Figure 28:
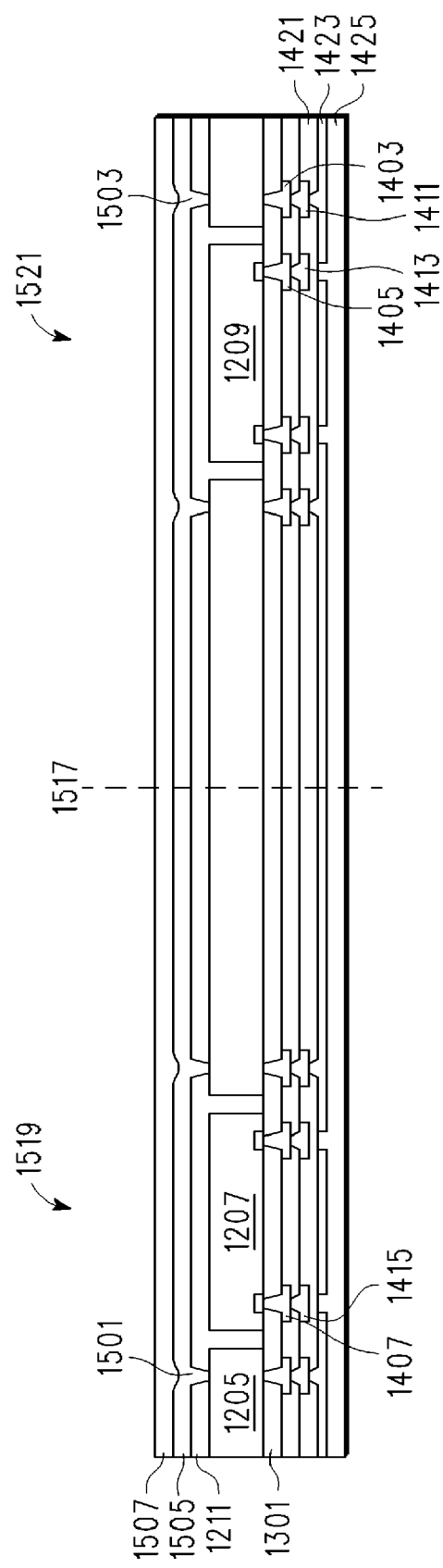

FIG. 28 is a side view of structure 1200 after it has been flipped and a shielding layer 1505 is formed to be electrically coupled to plane 1205. Prior to forming layer 1505, openings (e.g. 1501) are made in dielectric material 1211 to expose plane 1205. Afterwards, a layer of dielectric material 1507 is formed over layer 1505.

In subsequent processes, solder balls are added to structure 1200 on the bottom side of the view shown in FIG. 28. Shielding solder balls are formed by making openings in layer 1425 to expose shielding layer 1423. Non shielding solder balls are formed by making openings in layer 1425 and 1421 to expose the conductive structures desired for electrical coupling. Afterwards structure 1200 is singulated at line 1517 into separate integrated circuit packages.

In another embodiment, one or both of the shielding layers (e.g. 1505, 1423) maybe prefabricated prior to being attached to structure 1200. In one embodiment, conductive vias would be formed in the dielectric layer on which the prefabricated shielding layer is attached. The prefabricated shielding layer would then contact the conductive vias located in the dielectric layer.

In another embodiment, multiple ground planes may be utilized in a structure. In some embodiments, the ground planes may have different thicknesses that may be used with die having different thicknesses in the same package. In some embodiments, the ground plane may have different thicknesses at different levels to accommodate with the different thicknesses of the die.

Also, in other embodiments, a layered redistribution structure may include only one dielectric layer or more than one dielectric layer.

One advantage of the embodiment of FIG. 28 is that a ground plane may be incorporated with the integrated circuit packages that is encapsulated with the die wherein remaining portions of the shielding structures are added post encapsulation. With such an embodiment, the entire shielding structure does not have be completed prior to encapsulation, thereby allowing for flexibility in construction and a reduction of shielding formation complexity.

This description sets forth various embodiments for forming an integrated circuit package with electromagnetic shielding. A feature of a particular embodiment or a process for making a particular embodiment may be implemented in the other embodiments or used in making the other embodiments. For example, the back side EMI shield (e.g. 303, 1101, 1505) may be formed prior to removing the encapsulated structure (e.g. 173, 1001, and 1200) from the carrier and formed before the formation of the layered redistribution structure as described in the embodiments of FIGS. 1-13. Also, the shielding layer (e.g. 221, 911, 1019, 1423) over the active surface of the semiconductor die may be omitted from the integrated circuit package. The embodiments of FIGS. 1-13 may include such a shielding layer in their integrated circuit packages. Other features described herein with respect to one embodiment, may be implemented in the other embodiments as well.

In one embodiment, a method for making a package assembly with EMI shielding includes attaching a plurality of microelectronic devices to a releasable attachment device and encapsulating the plurality of microelectronic devices by forming an encapsulation package including the plurality of microelectronic devices. The encapsulation package comprising a first surface that contacts the releasable attachment device and a second surface opposite the first surface. The method includes forming one or more via openings through the second surface of the encapsulation package to surround a first encapsulated microelectronic circuit and forming a conductive layer over the encapsulation package to at least partially fill the one or more via openings, thereby forming a shielding via ring structure surrounding the first encapsulated microelectronic circuit. The method includes removing the releasable attachment device from the first surface of the encapsulation package to thereby expose the first encapsulated microelectronic circuit at the first surface of the encapsulation package, and forming a layered redistribution structure on the first surface of the encapsulation package.

Another embodiment includes a method of packaging a plurality of semiconductor die. The method includes forming an encapsulated structure including the plurality of semiconductor die. The encapsulated structure having a first major surface and a second major surface. The method also includes forming a first dielectric layer overlying the first major surface of the encapsulated structure, forming a plurality of openings in the first dielectric layer, forming a plurality of conductive structures for electrically coupling to conductive structures of each of the semiconductor die through the plurality of openings, and providing a shielding layer. The second major surface of the encapsulated structure is located between the first major surface of the encapsulated structure and the shielding layer. The method also includes forming a first shielding structure for providing electromagnetic shielding for at least one of the plurality of semiconductor die. The forming the first shielding structure includes forming at least one conductive structure. The forming the at least one conductive structure includes forming at least one opening in the encapsulated structure. The at least one opening extending at least partially through the encapsulated structure from at least one of the first major surface or the second major surface of the encapsulated structure. The forming the at least one conductive structure includes forming conductive material in the at least one opening to form at least one conductive structure. The shielding layer is electrically coupled to the at least one conductive structure. In one embodiment, the providing the shielding layer includes forming conductive material over the second major surface, wherein the forming conductive material over the second major includes the forming conductive material in the at least one opening.

Another embodiment includes a method of forming an integrated circuit package. The method includes locating a semiconductor die in a recess of a grounding layer and forming an encapsulated structure. The encapsulated structure includes the semiconductor die and the grounding layer. The method includes forming a first dielectric layer overlying a first major surface of the encapsulated structure, forming a plurality of vias in the first dielectric layer, and forming a first plurality of electrically conductive structures in a first subset of the plurality of vias. The first plurality of electrically conductive structures is electrically coupled to electrically conductive structures of the semiconductor die. The method also includes forming at least one opening in the encapsulated structure to expose the grounding layer and forming conductive material in the at least one opening to form at least one shielding structure, the at least one shielding structure electrically coupled to the grounding plane. The at least one shielding structure at locations that surround a location of the semiconductor die for providing electromagnetic shielding. The method also includes providing a shielding layer. The shielding layer is electrically coupled to the at least one shielding structure. A second major surface of the encapsulated structure is located between the first major surface of the encapsulated structure and the shielding layer. The method also includes forming a first plurality of conductive shielding vias in a second subset of the plurality of vias of the first dielectric layer. The shielding layer is electrically coupled to the first plurality of conductive shielding vias by the grounding layer.

In another embodiment, a method of forming a semiconductor package includes providing an encapsulation package comprising a plurality of circuit devices that are releasably attached to a process carrier and encapsulated with an encapsulant so as to expose the one or more circuit devices at a bottom surface of the encapsulation package. The method includes forming via openings in a first surface of the encapsulated package surrounding a first encapsulated circuit device and forming a conductive layer over the encapsulated package and in the via openings, thereby forming a shielding via ring structure surrounding the first encapsulated circuit device. The method also includes removing the process carrier from the bottom surface of the encapsulation package to thereby expose the first encapsulated circuit device at a second major surface of the encapsulation package. The method also includes forming a layered redistribution structure on the second major surface of the encapsulation package, and singulating the encapsulation package to separate the first encapsulated circuit device and its shielding via ring structure from another encapsulated circuit device of the encapsulation package.

Although the described exemplary embodiments disclosed herein are directed to various packaging assemblies and methods for making same, the present invention is not necessarily limited to the example embodiments which illustrate inventive aspects of the present invention that are applicable to a wide variety of packaging processes and/or devices. Thus, the particular embodiments disclosed above are illustrative only and should not be taken as limitations upon the present invention, as the invention may be modified and practiced in different but equivalent manners apparent to those skilled in the art having the benefit of the teachings herein. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A method for making an integrated circuit package, comprising:
attaching a plurality of microelectronic devices to a releasable attachment device;
encapsulating the plurality of microelectronic devices by forming an encapsulation package including the plurality of microelectronic devices, the encapsulation package comprising a first surface that contacts the releasable attachment device and a second surface opposite the first surface;
forming one or more via openings through the second surface of the encapsulation package to surround a first encapsulated microelectronic circuit;
forming a conductive layer over the encapsulation package to at least partially fill the one or more via openings, thereby forming a shielding via ring structure surrounding the first encapsulated microelectronic circuit;
removing the releasable attachment device from the first surface of the encapsulation package to thereby expose the first encapsulated microelectronic circuit at the first surface of the encapsulation package; and
forming a layered redistribution structure on the first surface of the encapsulation package.

2. The method of claim 1, where attaching the plurality of microelectronic devices to a releasable attachment device comprises using a double-sided tape layer to attach the plurality of microelectronic devices to a process carrier.

3. The method of claim 1, where attaching the plurality of microelectronic devices to a releasable attachment device comprises using a glue layer to attach the plurality of microelectronic devices to a process carrier.

4. The method of claim 1, where attaching the plurality of microelectronic devices to a releasable attachment device comprises attaching a grounding frame to the releasable attachment device.

5. The method of claim 1, where forming one or more via openings comprises cutting through the second surface of the encapsulation package to form one or more via openings by performing a laser cut through the encapsulation package.

6. The method of claim 1 wherein the forming the layered redistribution structure is performed after the forming a conductive layer.

7. The method of claim 1 wherein the forming the layered redistribution structure is performed before the forming the conductive layer.

8. The method of claim 1, where forming a layered redistribution structure on the first surface of the encapsulation package comprises forming a multi-layer layered redistribution structure including a shielding via structure which is substantially aligned with and electrically connected to the shielding via ring structure formed in the encapsulation package.

9. The method of claim 8, where the shielding via structure comprises a micro via structure in a layer of the multi-layer layered redistribution structure.

10. The method of claim 2, where attaching the plurality of microelectronic devices to a releasable attachment device comprises attaching a grounding frame to the releasable attachment device.

11. The method of claim 3, where attaching the plurality of microelectronic devices to a releasable attachment device comprises attaching a grounding frame to the releasable attachment device.

12. The method of claim 5, where attaching the plurality of microelectronic devices to a releasable attachment device comprises attaching a grounding frame to the releasable attachment device.

13. The method of claim 6, where attaching the plurality of microelectronic devices to a releasable attachment device comprises attaching a grounding frame to the releasable attachment device.

14. The method of claim 7, where attaching the plurality of microelectronic devices to a releasable attachment device comprises attaching a grounding frame to the releasable attachment device.

15. The method of claim 8, where attaching the plurality of microelectronic devices to a releasable attachment device comprises attaching a grounding frame to the releasable attachment device.

16. The method of claim 9, where attaching the plurality of microelectronic devices to a releasable attachment device comprises attaching a grounding frame to the releasable attachment device.

* * * * *